(12) United States Patent
Cho et al.

(10) Patent No.: US 11,411,066 B2
(45) Date of Patent: Aug. 9, 2022

(54) DISPLAY DEVICE AND METHOD FOR MANUFACTURING THE SAME

(71) Applicant: Samsung Display Co., LTD., Yongin-si (KR)

(72) Inventors: Hyun Min Cho, Hwaseong-si (KR); Sang Gab Kim, Seoul (KR); Tae Sung Kim, Incheon (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 128 days.

(21) Appl. No.: 17/030,951

(22) Filed: Sep. 24, 2020

(65) Prior Publication Data

US 2021/0202653 A1 Jul. 1, 2021

(30) Foreign Application Priority Data

Dec. 31, 2019 (KR) .................. 10-2019-0179846

(51) Int. Cl.
*H01L 27/32* (2006.01)
*H01L 51/56* (2006.01)

(52) U.S. Cl.
CPC ...... *H01L 27/3276* (2013.01); *H01L 27/3246* (2013.01); *H01L 51/56* (2013.01); *H01L 2227/323* (2013.01); *H01L 2251/308* (2013.01)

(58) Field of Classification Search
CPC .................................................. H01L 27/3276
See application file for complete search history.

(56) References Cited

U.S. PATENT DOCUMENTS

| 2006/0027804 A1* | 2/2006 | Yamazaki | ........... H01L 21/0262 257/E27.111 |
| 2016/0329391 A1* | 11/2016 | Ko | ........................ H01L 27/124 |
| 2020/0119126 A1* | 4/2020 | Jo | ........................ H01L 27/3258 |
| 2021/0327964 A1* | 10/2021 | Jeon | ........................ H01L 27/322 |

FOREIGN PATENT DOCUMENTS

| JP | 2016-167591 | 9/2016 |
| KR | 10-0768715 | 10/2007 |
| KR | 10-2011-0050122 | 5/2011 |
| KR | 10-2015-0014387 | 2/2015 |
| KR | 10-2018-0036818 | 4/2018 |

* cited by examiner

*Primary Examiner* — Douglas M Menz
(74) *Attorney, Agent, or Firm* — Kile Park Reed & Houtteman PLLC

(57) ABSTRACT

A display device and a method of the display device are provided. The display device includes a lower metal layer on a substrate, a buffer layer on the lower metal layer, a first semiconductor layer on the buffer layer, a gate insulating layer on the first semiconductor layer, a first gate electrode on the gate insulating layer, an interlayer insulating layer on the first gate electrode, a via layer on the interlayer insulating layer, a pixel electrode on the via layer and electrically connected to the first semiconductor layer, a light emitting layer on the pixel electrode, a common electrode on the light emitting layer, a first contact hole penetrating the buffer layer and the interlayer insulating layer and a second contact hole penetrating the interlayer insulating layer, and a first via hole and a second via hole each penetrating the via layer.

21 Claims, 23 Drawing Sheets

CFL : CFL1, CFL2, CFL3
WCL : WCL1, WCL2

DISPLAY DEVICE AND METHOD FOR MANUFACTURING THE SAME

CROSS-REFERENCE TO RELATED APPLICATION(S)

This application claims priority to and benefits of Korean Patent Application No. 10-2019-0179846 under 35 U.S.C. § 119, filed on Dec. 31, 2019, in the Korean Intellectual Property Office, the entire contents of which are incorporated herein by reference

BACKGROUND

1. Technical Field

The disclosure relates to a display device and a method for manufacturing the display device, and more specifically, to a display device and a manufacturing method thereof with a process of improved efficiency.

2. Description of the Related Art

The importance of display devices has steadily increased together with the development of multimedia technology. Various types of display devices such as a liquid crystal display (LCD), an organic light emitting display (OLED) and the like have been developed and used.

Among them, the organic light emitting display is a self-light emitting device that emits light by itself and has advantages such as fast response speed, high luminous efficiency and luminance, and a large viewing angle. The organic light emitting display may include pixels in a single panel. Each pixel may include an organic light emitting diode (OLED) disposed on a substrate on which thin film transistors are formed.

A display device is generally manufactured through mask processes as well as other fabrication processes. The mask processes may be used to pattern wirings, insulating films and the like, but the efficiency of manufacturing process may decrease as more mask processes are necessitated. Therefore, it is desired to improve the efficiency of manufacturing process by developing the mask processes and to produce display devices manufactured by means of the improved method.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide a display device capable of improving luminous efficiency.

Embodiments may also provide a method for manufacturing a display device capable of improving process efficiency.

However, embodiments are not restricted to those set forth herein. The above and other embodiments will become more apparent to one of ordinary skill in the art to which the disclosure pertains by referencing the detailed description of the disclosure given below.

In an embodiment, by using a hard mask layer or a photoresist pattern, a separate mask process for forming via holes and contact holes may be unnecessary. Accordingly, it is possible to reduce mask processes, and thus the process efficiency can be improved. Further, by using the hard mask layer or the photoresist pattern, it is possible to prevent a surface roughness of the via layer from being increased during a dry etching process. Accordingly, light efficiency can be improved. Furthermore, by forming a step between the via hole and the contact hole or forming taper angles to be different, a transparent conductive layer may be more efficiently/effectively deposited in a subsequent process, thereby preventing a short circuit of the transparent conductive layer.

The effects of the disclosure are not limited to the above-described effects and more effects other than the above are apparent to those skilled in the art from the following description.

According to an embodiment, a display device may include a lower metal layer disposed on a substrate, a buffer layer disposed on the lower metal layer, a first semiconductor layer disposed on the buffer layer, a gate insulating layer disposed on the first semiconductor layer, a first gate electrode disposed on the gate insulating layer overlapping the first semiconductor layer, an interlayer insulating layer disposed on the first gate electrode, a via layer disposed on the interlayer insulating layer, a pixel electrode disposed on the via layer and electrically connected to the first semiconductor layer, a light emitting layer disposed on the pixel electrode, a common electrode disposed on the light emitting layer, a first contact hole penetrating the buffer layer and the interlayer insulating layer and a second contact hole penetrating the interlayer insulating layer; and a first via hole and a second via hole each penetrating the via layer. The interlayer insulating layer may include a first upper surface not overlapping the via layer in the first via hole. The pixel electrode may be electrically connected to the lower metal layer through the first contact hole and the first via hole, electrically connected to the first semiconductor layer through the second contact hole and the second via hole, and disposed on an inner peripheral surface of the first via hole, the first upper surface of the interlayer insulating layer, and an inner peripheral surface of the first contact hole. The pixel electrode may contact the inner peripheral surface of the first via hole, the first upper surface of the interlayer insulating layer, and the inner peripheral surface of the first contact hole.

In an embodiment, the first contact hole may overlap the first via hole, and the second contact hole may overlap the second via hole.

In an embodiment, the first via hole may expose the first upper surface of the interlayer insulating layer surrounding the first contact hole.

In an embodiment, a diameter of the first via hole may be larger than a diameter of the first contact hole on a plane where the via layer and the interlayer insulating layer may contact each other.

In an embodiment, the interlayer insulating layer may include a second upper surface in contact with the via layer, the inner peripheral surface of the first via hole may have a first taper angle between the inner peripheral surface of the first via hole and the second upper surface of the interlayer insulating layer, the inner peripheral surface of the first contact hole may have a second taper angle between the inner peripheral surface of the first contact hole and the second upper surface of the interlayer insulating layer, and the first taper angle may be smaller than the second taper angle.

In an embodiment, the first taper angle may be equal to or greater than about 30 degrees and equal to or less than about 60 degrees.

In an embodiment, wherein a surface roughness of the via layer may be in a range of about 0.1 nm to about 2 nm.

In an embodiment, the display device may further include a data line disposed between the substrate and the buffer layer on the substrate, and a first bridge electrode disposed on the via layer.

In an embodiment, the display device may further include a second semiconductor layer spaced apart from the first semiconductor layer on the buffer layer, and a second gate electrode disposed on the gate insulating layer. The gate insulating layer may be disposed on the second semiconductor layer.

In an embodiment, the display device may further include a third contact hole penetrating the buffer layer and the interlayer insulating layer to expose the data line, a third via hole penetrating the via layer to expose the third contact hole, a fourth contact hole penetrating the interlayer insulating layer to expose a portion of the second semiconductor layer, and a fourth via hole penetrating the via layer to expose the fourth contact hole.

In an embodiment, the first bridge electrode may be electrically connected to the data line through the third contact hole and the third via hole, and electrically connected to the second semiconductor layer through the fourth contact hole and the fourth via hole.

In an embodiment, the display device may further include a fifth contact hole penetrating the interlayer insulating layer to expose another portion of the second semiconductor layer, a fifth via hole penetrating the via layer to expose the fifth contact hole, a sixth contact hole penetrating the interlayer insulating layer to expose the first gate electrode, a sixth via hole penetrating the via layer to expose the sixth contact hole, and a second bridge electrode disposed on the via layer.

In an embodiment, the second bridge electrode may be electrically connected to another portion of the second semiconductor layer through the fifth contact hole and the fifth via hole, and electrically connected to the first gate electrode through the sixth contact hole and the sixth via hole.

In an embodiment, the pixel electrode, the first bridge electrode, and the second bridge electrode may be disposed on a same layer and include a same material.

In an embodiment, a method for manufacturing a display device may include forming a lower metal layer disposed on a substrate, forming a buffer layer disposed on the lower metal layer, forming a first semiconductor layer disposed on the buffer layer, forming a patterned gate insulating layer and a first gate electrode on the first semiconductor layer, forming an interlayer insulating layer on the first gate electrode, forming a via layer on the interlayer insulating layer, forming a patterned hard mask layer on the via layer, forming a first via hole by etching the via layer using the patterned hard mask layer as an etching mask, forming a first contact hole by etching a portion of a first upper surface of the interlayer insulating layer exposed by the first via hole and the buffer layer formed under the interlayer insulating layer, removing the patterned hard mask layer, forming a pixel electrode on the via layer, an inner peripheral surface of the first via hole, the first upper surface of the interlayer insulating layer exposed by the first via hole, and an inner peripheral surface of the first contact hole formed in the interlayer insulating layer, forming a light emitting layer on the pixel electrode, and forming a common electrode on the light emitting layer.

In an embodiment, the steps of etching the via layer, the interlayer insulating layer, and the buffer layer may include performing a dry etching process using the patterned hard mask layer.

In an embodiment, the via layer may be etched by an isotropic dry etching process, and the interlayer insulating layer and the buffer layer may be etched by an anisotropic dry etching process.

In an embodiment, the isotropic dry etching process and the anisotropic dry etching process may be performed by using a reaction gas containing fluorine (F) and oxygen ($O_2$).

In an embodiment, the anisotropic dry etching process may be performed by increasing the content of fluorine (F) and reducing the content of oxygen ($O_2$) in comparison to the isotropic dry etching process.

In an embodiment, the patterned hard mask layer may include one selected from the group of consisting of ITO, IZO, IGZO, AlOx, ZrOx and HfOx.

BRIEF DESCRIPTION OF THE DRAWINGS

The embodiments of the disclosure will be described in detail with reference to the attached drawings, in which.

DETAILED DESCRIPTION OF THE EMBODIMENTS

Figure 1:
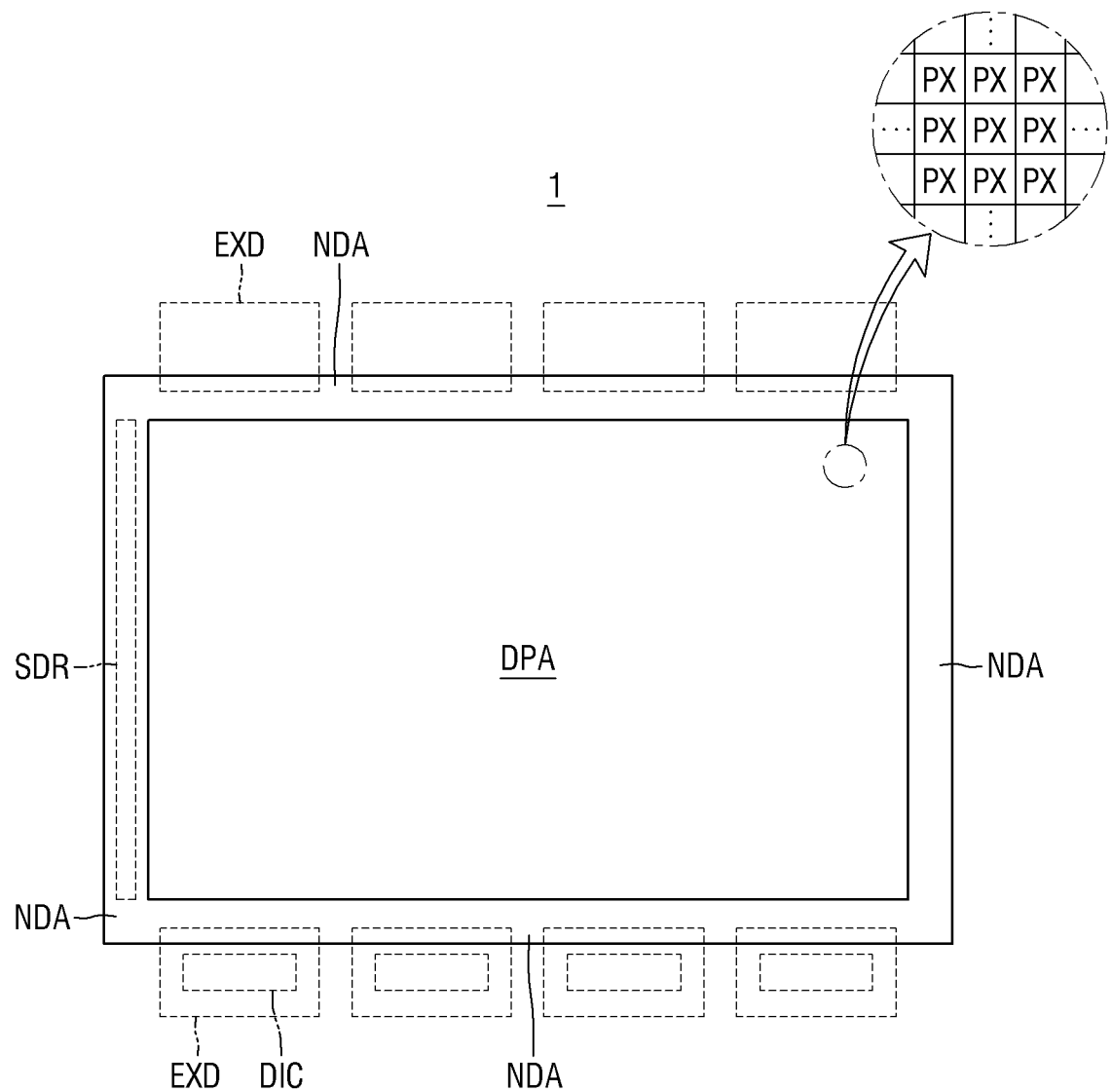
FIG. 1 is a schematic plan view of a display device according to an embodiment.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Some of the parts which are not associated with the description may not be provided to describe embodiments of the invention and like reference numerals refer to like elements throughout the specification.

In the drawings, sizes, thicknesses, and roughness of elements may be enlarged for clarity and ease of description thereof. However, the invention is not limited to the illustrated sizes and thicknesses. In the drawings, the thicknesses of layers, films, panels, regions, and other elements may be exaggerated for clarity. In the drawings, for better understanding and ease of description, the thicknesses of some layers and areas may be exaggerated.

The singular forms "a," "an," and "the" are intended to include the plural forms as well, unless the context clearly indicates otherwise.

Although the terms "first," "second," etc. may be used herein to describe various elements, these elements should not be limited by these terms. These terms are only used to distinguish one element from another.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the drawing figures, dimensions may be exaggerated for clarity of illustration.

It will be understood that when an element may be referred to as being "between" two elements, it can be the only element between the two elements, or one or more intervening elements may also be present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Throughout the specification, when an element is referred to as being "connected" to another element, the element may be "directly connected" to another element, or "electrically connected" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described in detail with reference to the accompanying drawings.

FIG. 1 is a schematic plan view of a display device according to an embodiment.

Referring to FIG. 1, a display device 1 according to an embodiment may be applied to a smartphone, a mobile phone, a tablet PC, a personal digital assistant (PDA), a portable multimedia player (PMP), a television, a game machine, a wristwatch-type electronic device, a head-mounted display, a monitor of a personal computer, a laptop computer, a car navigation system, a car's dashboard, a digital camera, a camcorder, an external billboard, an electronic billboard, a medical device, an inspection device, various household appliances such as a refrigerator and a washing machine, or an Internet-of-Things device. Herein, a television (TV) is described as an example of a display device, and the TV may have a high resolution or an ultra high resolution such as HD, UHD, 4K and 8K.

The display device 1 according to embodiments may be classified into various types according to a display method. Examples of the display device may include an organic light emitting display (OLED), an inorganic light emitting display (inorganic EL), a quantum dot light emitting display (QED), a micro-LED display, a nano-LED display, a plasma display device (PDP), a field emission display (FED) and a cathode ray tube (CRT) display, a liquid crystal display (LCD), an electrophoretic display (EPD) and the like. Hereinafter, the organic light emitting display will be described as an example of the display device, and the organic light emitting display applied to the embodiment will be simply referred to as a display device unless special distinction is required. However, the embodiment is not limited to the organic light emitting display, and other display devices mentioned above or known in the art may be applied within the scope of the same inventive concept.

The display device 1 according to the embodiment may have a square shape, e.g., a rectangular shape in plan view. In a case where the display device 1 is a television, the display device 1 may be disposed such that its long side extends in a horizontal direction. However, the disclosure is not limited thereto, and the long side of the display device 1 may extend in a vertical direction. As another example, the display device 1 may be installed to be rotatable such that its long side is variably positioned to extend in the horizontal or vertical direction.

The display device 1 may include a display area DPA and non-display areas NDA. The display area DPA may be an active area in which an image is displayed. The display area DPA may have a rectangular shape in plan view like the overall shape of the display device 1, but the disclosure is not limited thereto.

The display area DPA may include pixels PX. The pixels PX may be arranged in a matrix. The shape of each pixel PX may be rectangular or square in plan view. However, without being limited thereto, each pixel PX may have a rhombic shape of which each side is inclined with respect to a side direction of the display device 1. The pixels PX may include various color pixels PX. For example, the pixels PX may include, a first color pixel PX of red, a second color pixel PX of green, and a third color pixel PX of blue, although not limited thereto. The color pixels PX may be alternately arranged in a stripe type or a pentile type.

The non-display areas NDA may be disposed adjacent to or around the display area DPA. The non-display areas NDA may completely or partially surround the display area DPA. The display area DPA may have a rectangular shape, and the non-display areas NDA may be disposed adjacent to four sides of the display area DPA. The non-display areas NDA may form a bezel of the display device 1.

In the non-display areas NDA, a driving circuit or a driving element for driving the display area DPA may be disposed. In an embodiment, pad portions disposed on a display substrate of the display device 1 may be provided in a first non-display area NDA disposed adjacent to a first long side (lower side in FIG. 1) of the display device 1 and a second non-display area NDA may be disposed adjacent to a second long side (upper side in FIG. 1) of the display device 1. External devices EXD may be mounted on pad electrodes of the pad portions. The external devices EXD may include, e.g., a connection film, a printed circuit board, a driver integrated circuit (DIC), a connector, a wire connection film, and the like. A scan driver SDR directly formed on the display substrate of the display device 1 may be provided in a third non-display area NDA disposed adjacent to a first short side (left side in FIG. 1) of the display device 1.

Figure 2:
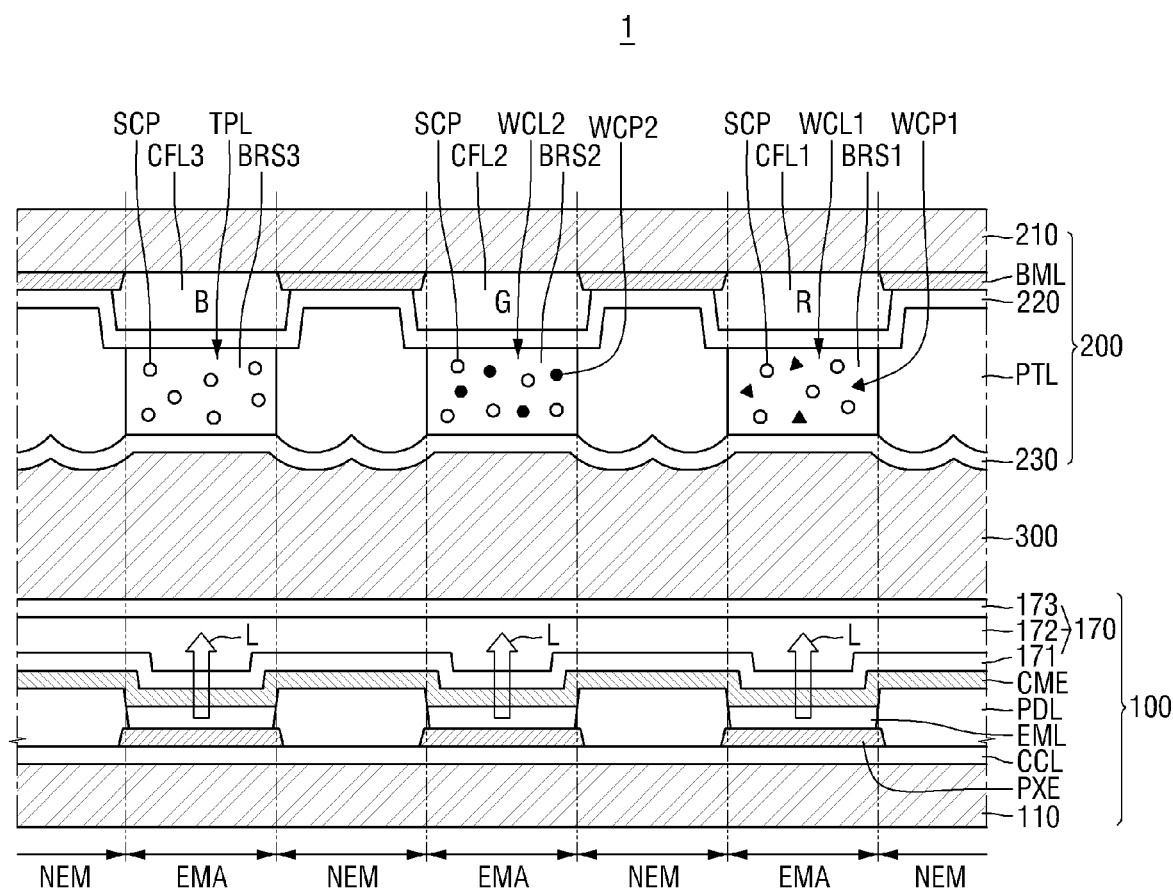
FIG. 2 is a schematic cross-sectional view of a display device according to an embodiment.

FIG. 2 is a schematic cross-sectional view of a display device according to an embodiment.

FIG. 2 illustrates a display device of a top emission type in which light L is emitted in an opposite direction (toward a second substrate 210) rather than a direction toward a first substrate 110 on which light emitting layers EML may be formed. However, the disclosure is not limited thereto. The display device may be of a bottom emission type in which light is emitted in the direction toward the first substrate 110 on which the light emitting layers EML are formed, or a double-sided emission type in which light is emitted in both the direction toward the first substrate 110 and the direction toward the second substrate 210.

Referring to FIG. 2, the display device 1 may include a first display substrate 100, a second display substrate 200 facing the first display substrate 100, and a filling layer 300 which serves to adhere the first display substrate 100 and the second display substrate 200.

The first display substrate 100 may include the first substrate 110. The first substrate 110 may be an insulating substrate. The first substrate 110 may include a transparent material. For example, the first substrate 110 may include a transparent insulating material such as glass, quartz, or the like. The first substrate 110 may be a rigid substrate. However, the structure and the material of the first substrate 110 are not limited thereto. The first substrate 110 may include plastic such as polyimide or the like, and may have a flexible property such that it can be bent, folded, or rolled.

Pixel electrodes PXE may be disposed on the first substrate 110. Each pixel electrode PXE may be disposed for each pixel PX. The pixel electrodes PXE of the neighboring pixels PX may be separated from each other. A circuit layer CCL for driving the pixels PX may be disposed on the first substrate 110. The circuit layer CCL may be provided between the first substrate 110 and the pixel electrodes PXE. A detailed description of the circuit layer CCL follows.

The pixel electrode PXE may be a first electrode (e.g., an anode electrode) of a light emitting diode. The pixel electrode PXE may have a stacked structure formed by stacking a material layer having a high work function, such as indium tin oxide (ITO), indium zinc oxide (IZO), zinc oxide (ZnO) and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof. The material layer having a high work function may be disposed above the reflective material layer and disposed closer to the light emitting layers EML.

The pixel electrode PXE may have a multilayer structure such as ITO/Mg, ITO/MgF, ITO/Ag and ITO/Ag/ITO, but is not limited thereto.

A pixel defining layer PDL may be disposed on a surface of the first substrate 110 along the boundaries of the pixels PX. The pixel defining layer PDL is disposed on the pixel electrodes PXE and may include openings to expose the pixel electrodes PXE. Emission areas EMA and non-emission areas NEM may be distinguished by the pixel defining layer PDL and the openings of the pixel defining layer PDL. The pixel defining layer PDL may include an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB). The pixel defining layer PDL may include an inorganic material.

The light emitting layers EML may be disposed on the pixel electrodes PXE exposed by the pixel defining layer PDL. In an embodiment in which the display device 1 is an organic light emitting display, the light emitting layers EML may include an organic layer having an organic material. The organic layer may have an organic light emitting layer, and in some cases, may further have at least one of a hole injection layer, a hole transport layer, an electron transport layer, or an electron injection layer as an auxiliary layer for light emission. In another embodiment, when the display device 1 is a micro LED display, a nano LED display or the like, the light emitting layers EML may include an inorganic material such as an inorganic semiconductor.

In some embodiments, the light emitting layers EML may have a tandem structure in which organic light emitting layers are superposed in the thickness direction and a charge generation layer is disposed between the organic light emitting layers. The respective organic light emitting layers superposed may emit light of the same wavelength, or may emit light of different wavelengths. At least a portion of the light emitting layer EML of each pixel PX may be separated from the same layer of the neighboring pixel PX.

In an embodiment, the wavelengths of light emitted from the respective light emitting layers EML may be the same regardless of the color pixels PX. For example, the light emitting layer EML of each color pixel PX may emit blue light or ultraviolet rays, and a color control structure which will be described later may include a wavelength conversion layer WCL, thereby displaying a color for each pixel PX.

In another embodiment, the wavelength of light emitted from each light emitting layer EML may be different for each color pixel PX. For example, the light emitting layer EML of the first color pixel PX may emit light in a first color, the light emitting layer EML of the second color pixel PX may emit light in a second color, and the light emitting layer EML of the third color pixel PX may emit light in a third color.

A common electrode CME may be disposed on the light emitting layers EML. The common electrode CME may be electrically connected with the light emitting layers EML as well as the top surface of the pixel defining layer PDL.

The common electrode CME may be continuous across the pixels PX. The common electrode CME may be a full surface electrode disposed over the entire surface without distinguishing the pixels PX. The common electrode CME may be a second electrode (e.g., a cathode electrode) of a light emitting diode.

The common electrode CME may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg). The common electrode CME may further include a transparent metal oxide layer disposed on the material layer having a low work function.

The pixel electrode PXE, the light emitting layer EML, and the common electrode CME may constitute a light emitting element (e.g., an OLED). Light emitted from the light emitting layer EML may be emitted upward through the common electrode CME.

A thin film encapsulation structure 170 may be disposed on the common electrode CME. The thin film encapsulation structure 170 may include at least a thin film encapsulation layer. For example, the thin film encapsulation layer may include a first inorganic film 171, an organic film 172, and a second inorganic film 173. Each of the first inorganic film 171 and the second inorganic film 173 may include silicon nitride (SiNx), silicon oxide (SiOx), silicon oxynitride (SiOxNy), or the like. The organic film 172 may include an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB).

The second display substrate 200 may be disposed above the thin film encapsulation structure 170 to face the thin film encapsulation structure 170. The second substrate 210 of the second display substrate 200 may include a transparent material. The second substrate 210 may include a transparent insulating material such as glass, quartz, or the like. The second substrate 210 may be a rigid substrate. However, the second substrate 210 is not limited thereto. The second substrate 210 may include plastic such as polyimide or the like, and may have a flexible property such that it can be bent, folded, or rolled.

The second substrate 210 may be the same substrate as the first substrate 110, but may have a different material, thickness, transmittance, and/or the like. For example, the second substrate 210 may have a higher transmittance than the first substrate 110. The second substrate 210 may be thicker or thinner than the first substrate 110.

A light blocking member BML may be disposed on a surface of the second substrate 210 facing the first substrate 110 along the boundaries of the pixels PX. The light blocking member BML may overlap the pixel defining layer PDL of the first display substrate 100 and may be positioned in the non-emission areas NEM. The light blocking member BML may include openings to expose the surface of the second substrate 210 overlapping the emission areas EMA. The light blocking member BML may be formed in a grid shape in plan view.

The light blocking member BML may include an organic material. The light blocking member BML may reduce color distortion due to external light reflection by absorbing the external light. Further, the light blocking member BML may serve to prevent light which is emitted from the light emitting layer EML from entering the adjacent pixels PX.

In an embodiment, the light blocking member BML may absorb all visible wavelengths. The light blocking member BML may include a light absorbing material. For example, the light blocking member BML may be formed of a material used as a black matrix of the display device 1.

In another embodiment, the light blocking member BML may absorb light of specific wavelengths among visible wavelengths and transmit light of other wavelengths. For example, the light blocking member BML may include the same material as one of color filter layers CFL. Specifically, the light blocking member BML may be formed of the same material as a blue color filter layer (see CFL3 in FIG. 2). In some embodiments, the light blocking member BML may be integrally formed with the blue color filter layer. Alternatively, the light blocking member BML may be omitted.

The color filter layers CFL may be disposed on the surface of the second substrate 210 on which the light blocking member BML is disposed. The color filter layers CFL may be provided on the surface of the second substrate 210 which is exposed through the openings of the light blocking member BML. Further, each color filter layer CFL may be partially disposed on the adjacent light blocking member BML.

The color filter layer CFL may include a first color filter layer CFL1 disposed on the first color pixel PX, a second color filter layer CFL2 disposed on the second color pixel PX, and a third color filter layer CFL3 disposed on the third color pixel PX. Each of color filter layers CFL may include a colorant such as a dyes or a pigment that absorbs wavelengths other than the corresponding color wavelength. The first color filter layer CFL1 may be a red color filter layer, the second color filter layer CFL2 may be a green color filter, and the third color filter layer CFL3 may be a blue color filter layer. In the drawing, neighboring color filter layers CFL are disposed to be spaced apart from each other on the light blocking member BML, but the neighboring color filter layers CFL may partially overlap each other on the light blocking member BML.

A first capping layer 220 may be disposed on the color filter layers CFL. The first capping layer 220 may prevent impurities such as moisture or air from permeating from the outside and damaging or contaminating the color filter layers CFL. Further, the first capping layer 220 may prevent the colorants of the color filter layers CFL from being diffused into other members.

The first capping layer 220 may be electrically connected with or in direct contact with a surface (bottom surface in FIG. 2) of the color filter layer CFL. The first capping layer 220 may be made of an inorganic material. For example, the first capping layer 220 may include silicon nitride, aluminum nitride, zirconium nitride, titanium nitride, hafnium nitride, tantalum nitride, silicon oxide, aluminum oxide, titanium oxide, tin oxide, silicon oxynitride, or the like.

A partition wall PTL may be disposed on the first capping layer 220. The partition wall PTL may be disposed in the non-emission area NEM. The partition wall PTL may be disposed to overlap the light blocking member BML. The partition wall PTL may include openings exposing the color filter layers CFL. The partition wall PTL may include a photosensitive organic material, but the disclosure is not limited thereto. The partition wall PTL may further include a light blocking material.

The wavelength conversion layer WCL and/or a light transmitting layer TPL may be disposed in spaces exposed through the openings of the partition wall PTL. The wavelength conversion layer WCL and the light transmitting layer TPL may be formed by an inkjet process using the partition wall PTL as a bank, but the disclosure is not limited thereto.

In an embodiment in which the light emitting layer EML of each pixel PX emits light in a third color, the wavelength conversion layer WCL may include a first wavelength conversion pattern WCL1 disposed in the first color pixel PX and a second wavelength conversion pattern WCL2 disposed in the second color pixel PX. The light transmitting layer TPL may be disposed in the third color pixel PX.

The first wavelength conversion pattern WCL1 may include a first base resin BRS1 and a first wavelength conversion material WCP1 provided in the first base resin BRS1. The second wavelength conversion pattern WCL2 may include a second base resin BRS2 and a second wavelength conversion material WCP2 provided in the second base resin BRS2. The light transmitting layer TPL may include a third base resin BRS3 and scatterers SCP provided in the third base resin BRS3.

The first to third base resins BRS1, BRS2 and BRS3 may include a light-transmitting organic material. For example, the first to third base resins BRS1, BRS2 and BRS3 may include an epoxy resin, an acrylic resin, a cardo resin, an imide resin, or the like. The first to third base resins BRS1, BRS2 and BRS3 may be formed of the same material, but the disclosure is not limited thereto.

The scatterers SCP may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like.

The first wavelength conversion material WCP1 may convert the third color into a first color, and the second wavelength conversion material WCP2 may convert the third color into a second color. The first wavelength conversion material WCP1 and the second wavelength conversion material WCP2 may be quantum dots, quantum bars, phosphors, or the like. Examples of the quantum dots may include group IV nanocrystals, group II-VI compound nanocrystals, group III-V compound nanocrystals, group IV-VI nanocrystals, and combinations thereof. The first wavelength conversion pattern WCL1 and the second wavelength conversion pattern WCL2 may further include scatterers SCP for increasing wavelength conversion efficiency.

The light transmitting layer TPL disposed in the third color pixel PX may transmit light of the third color emitted from the light emitting layer EML while maintaining the wavelength of the light. The scatterers SCP of the light transmitting layer TPL may control an emission path of the light emitted through the light transmitting layer TPL. The light transmitting layer TPL may not include a wavelength conversion material.

A second capping layer 230 may be disposed on the wavelength conversion layer WCL, the light transmitting layer TPL, and the partition wall PTL. The second capping layer 230 may be formed of an inorganic material. The second capping layer 230 may include a material selected from the above-mentioned materials of the first capping layer 220. The first capping layer 220 and the second capping layer 230 may be formed of the same material, but the disclosure is not limited thereto.

The filling layer 300 may be disposed between the first display substrate 100 and the second display substrate 200. The filling layer 300 may fill a space between the first display substrate 100 and the second display substrate 200, and may serve to bond them to each other. The filling layer 300 may be disposed between the thin film encapsulation structure 170 of the first display substrate 100 and the second capping layer 230 of the second display substrate 200. The filling layer 300 may be formed of a Si-based organic material, an epoxy-based organic material, or the like, but the disclosure is not limited thereto.

Hereinafter, the circuit layer CCL of the display device 1 will be described in detail.

Figure 3:
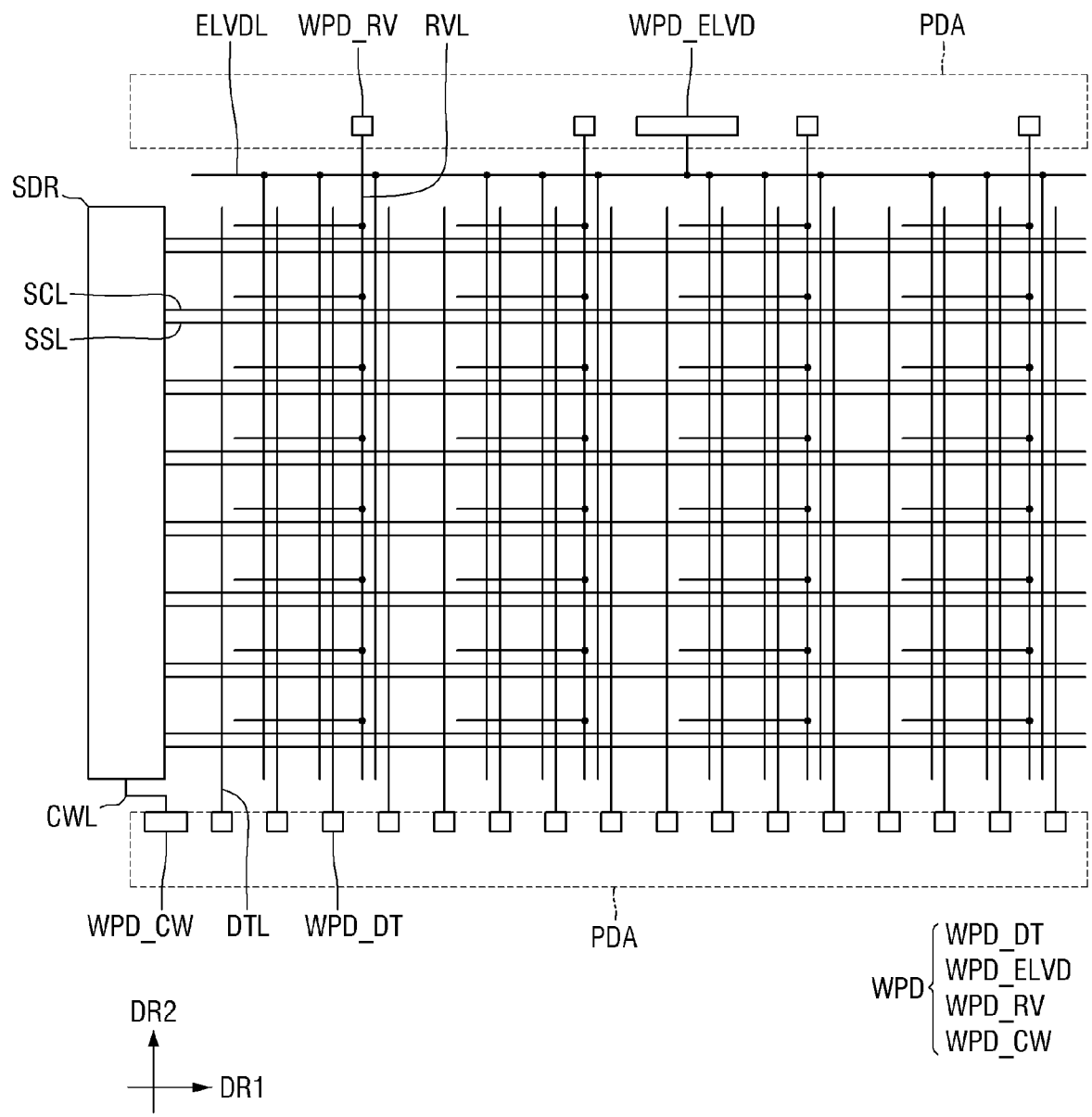
FIG. 3 is a schematic layout view illustrating a circuit layer of a first display substrate of a display device according to an embodiment.

FIG. 3 is a schematic layout view illustrating the circuit layer of the first display substrate of the display device according to an embodiment.

Referring to FIG. 3, wirings are disposed on the first substrate 110. The wirings may include a scan line SCL, a sensing signal line SSL, a data line DTL, a reference voltage line RVL, a first power line ELVDL, and the like.

The scan line SCL and the sensing signal line SSL may extend in a first direction DR1. The scan line SCL and the sensing signal line SSL may be electrically connected to the scan driver SDR. The scan driver SDR may include a driving circuit formed of the circuit layer CCL. The scan driver SDR may be disposed in the third non-display area NDA on the first substrate 110, but the disclosure is not limited thereto. The scan driver SDR may be disposed in a fourth non-display area NDA or may be disposed in both the third and fourth non-display areas NDA. The scan driver SDR may be electrically connected to a signal connection wiring CWL, and at least one end of the signal connection wiring CWL may form a pad WPD_CW on the first non-display area NDA and/or the second non-display area NDA which may be electrically connected to the external devices (EXD in FIG. 1).

The data line DTL and the reference voltage line RVL may extend in a second direction DR2 intersecting the first direction DR1. The first power line ELVDL may include portions extending in the second direction DR2. The first power line ELVDL may further include a portion extending in the first direction DR1. The first power line ELVDL may have a mesh structure, but the disclosure is not limited thereto.

At least one end of each of the data line DTL, the reference voltage line RVL, and the first power line ELVDL may be provided with wiring pads WPD. Each wiring pad WPD may be provided in a pad portion PDA of the corresponding non-display area NDA. In an embodiment, a wiring pad WPD_DT (hereinafter, referred to as "data pad") of the data line DTL may be disposed in the pad portion PDA of the first non-display area NDA. A wiring pad WPD_RV (hereinafter referred to as "reference voltage pad") of the reference voltage line RVL and a wiring pad WPD_ELVD (hereinafter referred to as "first power pad") of the first power line ELVDL may be disposed in the second non-display area NDA. As another example, the data pad WPD_DT, the reference voltage pad WPD_RV, and the first power pad WPD_ELVD may all be disposed in the same area, e.g., the first non-display area NDA. As described above, the external devices (EXD in FIG. 1) may be mounted on the wiring pads WPD. The external devices EXD may be mounted on the wiring pads WPD by applying an anisotropic conductive film, ultrasonic bonding, or the like.

Each pixel PX on the first substrate 110 may include a pixel driving circuit. The above-described wirings may pass through each pixel PX or the periphery thereof to apply a driving signal to each pixel driving circuit. The pixel driving circuit may include transistors and capacitors. The number of transistors and capacitors of each pixel driving circuit may be variously modified. Hereinafter, the pixel driving circuit will be described in conjunction with a 3T1C (three-transistor, one-capacitor) structure including three transistors and one capacitor as an example. However, the disclosure is not limited thereto, and other modified pixel PX structures such as a 2T1C (two-transistor, one-capacitor) structure, a 7T1C (seven-transistor, one-capacitor) structure, and a 6T1C (six-transistor, one-capacitor) structure may be adopted.

Figure 4:
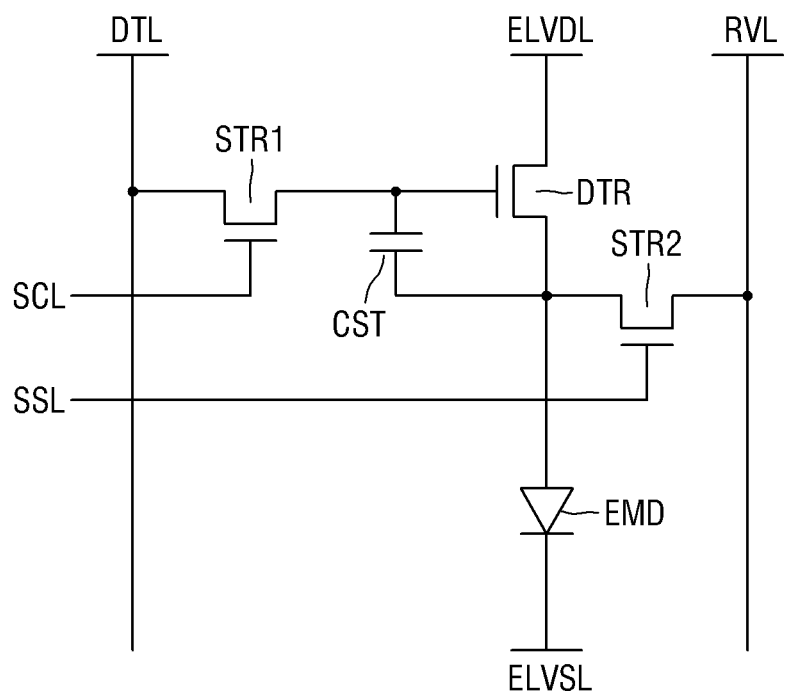
FIG. 4 is a schematic diagram of an equivalent circuit of a pixel of a display device according to an embodiment.

FIG. 4 is a schematic diagram of an equivalent circuit of a pixel of a display device according to an embodiment.

Referring to FIG. 4, each pixel PX of the display device according to an embodiment may include three transistors DTR, STR1, and STR2 and one storage capacitor CST in addition to a light emitting element EMD.

The light emitting element EMD may emit light according to a current supplied through a driving transistor DTR. The light emitting element EMD may be implemented as an OLED, a micro light emitting diode, a nano light emitting diode or the like.

A first electrode (i.e., anode electrode) of the light emitting element EMD may be electrically connected to a source electrode of the driving transistor DTR, and a second electrode (i.e., the cathode electrode) of the light emitting element EMD may be electrically connected to a second power line ELVSL to which a low potential voltage (second source voltage) lower than a high potential voltage (first source voltage) of the first power line ELVDL is supplied.

The driving transistor DTR may adjust a current flowing from the first power line ELVDL, to which the first source voltage is applied, to the light emitting element EMD according to a voltage difference between a gate electrode and the source electrode. The gate electrode of the driving transistor DTR may be electrically connected to a first source/drain electrode of the first switching transistor STR1, the source electrode of the driving transistor DTR may be electrically connected to the first electrode of the light emitting element EMD, and a drain electrode of the driving transistor DTR may be electrically connected the first power line ELVDL to which the first source voltage is applied.

The first switching transistor STR1 may be turned on by a scan signal applied from the scan line SCL to electrically connect the data line DTL to the gate electrode of the driving transistor DTR. A gate electrode of the first switching transistor STR1 may be electrically connected to the scan line SCL, the first source/drain electrode of the first switching transistor STR1 may be electrically connected to the gate electrode of the driving transistor DTR, and a second source/drain electrode of the first switching transistor STR1 may be electrically connected to the data line DTL.

The second switching transistor STR2 may be turned on by a sensing signal applied from the sensing signal line SSL to electrically connect the reference voltage line RVL to the source electrode of the driving transistor DTR. A gate electrode of the second switching transistor STR2 may be electrically connected to the sensing signal line SSL, the first source/drain electrode of the second switching transistor STR2 may be electrically connected to the reference voltage line RVL, and the second source/drain electrode of the second switching transistor STR2 may be electrically connected to the source electrode of the driving transistor DTR.

In an embodiment, the first source/drain electrode of each of the first and second switching transistors STR1 and STR2 may be a source electrode, and the second source/drain electrode of each of the first and second switching transistors STR1 and STR2 may be a drain electrode. However, the disclosure is not limited thereto, and the opposite case may be applied.

The capacitor CST may be formed between the gate electrode and the source electrode of the driving transistor DTR. The storage capacitor CST may store a difference voltage between a gate voltage and a source voltage of the driving transistor DTR.

The driving transistor DTR, the first switching transistor STR1, and the second switching transistor STR2 may be formed as thin film transistors. In the description of FIG. 3, it is assumed that the driving transistor DTR, the first switching transistor STR1, and the second switching transistor STR2 are N-type metal oxide semiconductor field effect transistors (MOSFETs), but the types of the transistors are not limited thereto. For example, the driving transistor DTR, the first switching transistor STR1, and the second switching transistor STR2 may be P-type MOSFETs, or some of the driving transistor DTR, the first switching transistor STR1, and the second switching transistor STR2 may be N-type MOSFETs, while others may be P-type MOSFETs.

Figure 5:
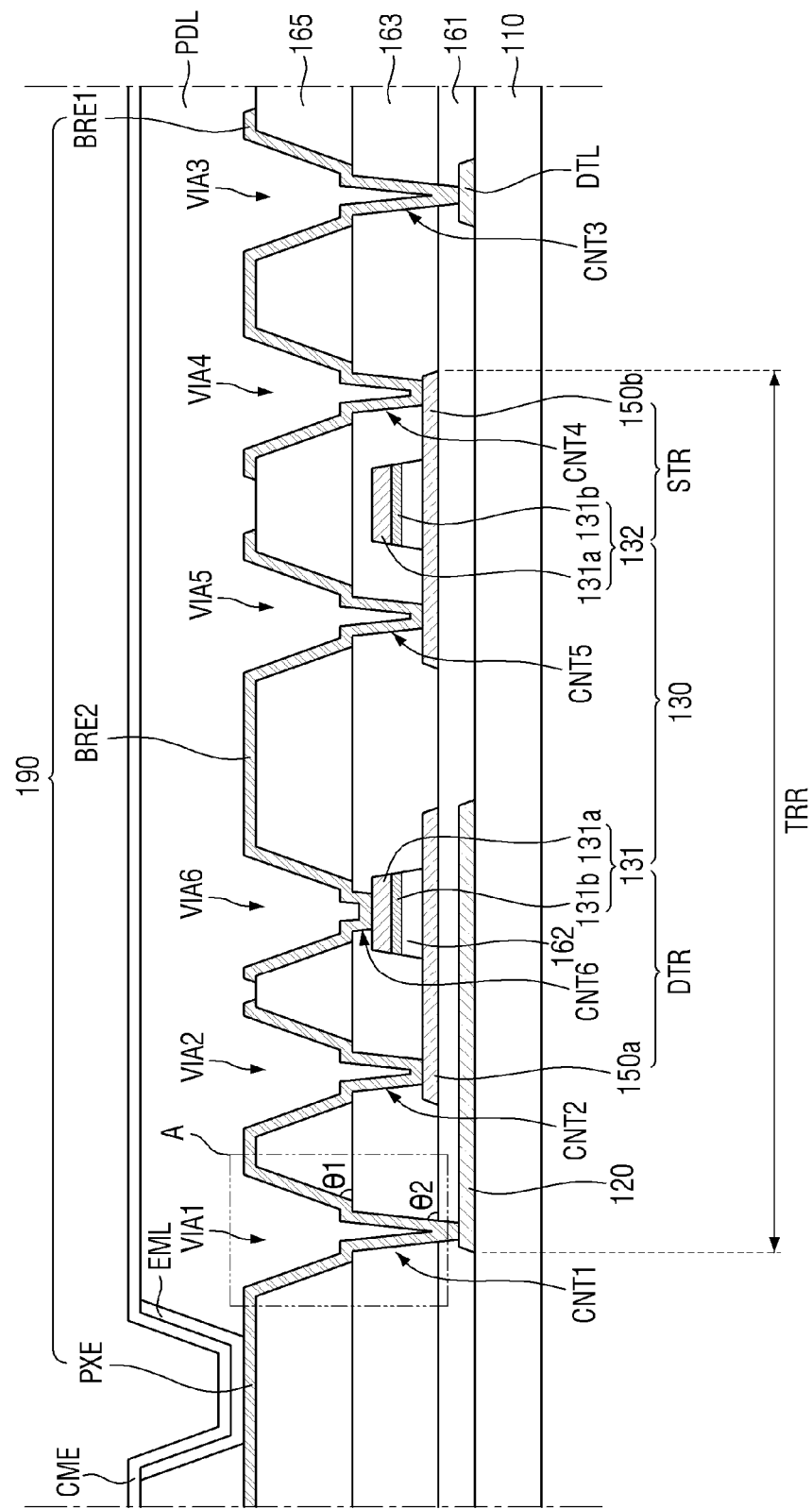
FIG. 5 is a schematic cross-sectional view of a first display substrate of a display device according to an embodiment.
Figure 6:
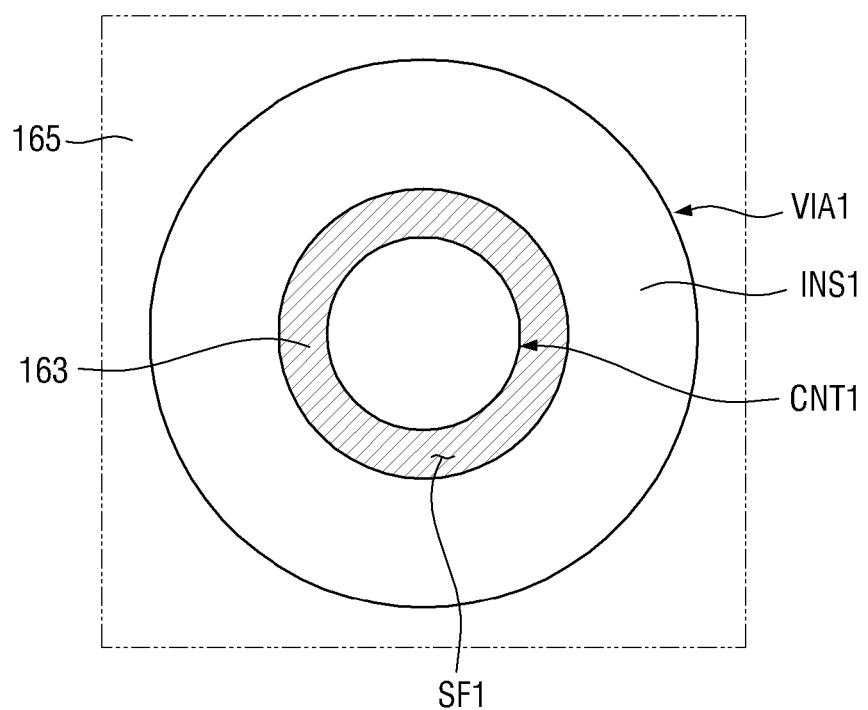
FIG. 6 is a schematic plan view of a via hole and a contact hole when viewed from the above.
Figure 7:
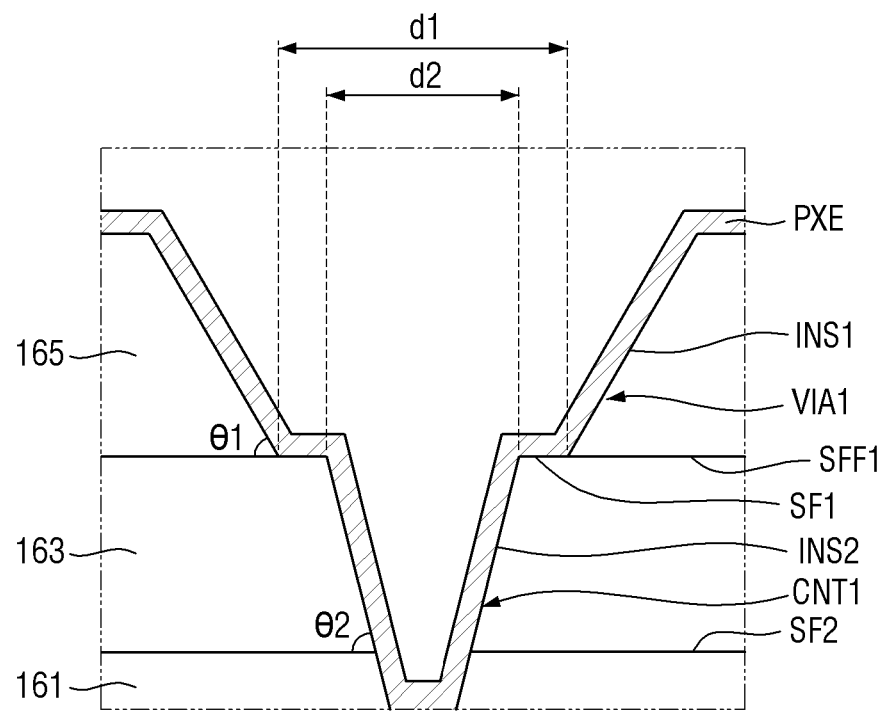
FIG. 7 is a schematic enlarged cross-sectional view of region A of FIG. 5.

FIG. 5 is a schematic cross-sectional view of the first display substrate of the display device according to an embodiment. FIG. 6 is a schematic plan view of the via hole and the contact hole when viewed from the above. FIG. 7 is a schematic enlarged cross-sectional view of region A of FIG. 5. In FIG. 5, a portion of the display area DPA is illustrated. As a cross section of the display area DPA, a cross section of a transistor region TRR of a pixel is shown. The transistor region TRR shown in FIG. 5 is a region in which the first switching transistor STR1 (switching transistor STR in FIG. 5) and the driving transistor DTR among the three transistors may be disposed. FIG. 5 illustrates the stacked structure of the first display substrate 100 which includes the pixel defining layer PDL and the circuit layer CCL.

Referring to FIG. 5, the circuit layer CCL may include a first semiconductor layer 150a, a second semiconductor layer 150b, conductive layers, and insulating layers disposed on the first substrate 110. The first and second semiconductor layers 150a and 150b may include oxide semiconductors. The conductive layers may include a lower metal layer 120, a gate conductive layer 130, and the pixel electrode PXE. The insulating layers may include a buffer layer 161, a gate insulating layer 162, an interlayer insulating layer 163, a via layer 165, and the pixel defining layer PDL.

In an embodiment, the lower metal layer 120 and the data line DTL may be disposed on the first substrate 110. The lower metal layer 120 may be a light blocking layer that serves to protect the first semiconductor layer 150a of the driving transistor DTR from external light. The lower metal layer 120 may have a patterned shape. The lower metal layer 120 may be disposed in the transistor region TRR. For example, the lower metal layer 120 may be disposed under the driving transistor DTR. The lower metal layer 120 may be disposed under the driving transistor DTR to cover at least a channel region of the first semiconductor layer 150a. The lower metal layer 120 may be disposed to cover the entire first semiconductor layer 150a. The lower metal layer 120 may be electrically connected to the first semiconductor layer 150a through a first contact hole CNT1, a second contact hole CNT2, a first via hole VIA1, and a second via hole VIA2 to suppress change of the voltage of the driving transistor DTR.

The data line DTL may be disposed outside the transistor region TRR. For example, the data line DTL may be disposed adjacent to the switching transistor STR. The data line DTL may be electrically connected to the second semiconductor layer 150b of the switching transistor STR through a third contact hole CNT3, a fourth contact hole CNT4, a third via hole VIA3, and a fourth via hole VIA4 to transfer a data signal to the switching transistor STR. The lower metal layer 120 and the data line DTL may be formed of a Ti/Cu double layer in which a titanium layer and a copper layer are stacked, but the disclosure is not limited thereto.

The buffer layer 161 may be disposed on the lower metal layer 120 and the data line DTL. The buffer layer 161 may be disposed to cover the entire surface of the first substrate 110 on which the lower metal layer 120 and the data line DTL are formed. The buffer layer 161 may include silicon nitride, silicon oxide, silicon oxynitride, or the like. In an embodiment, the buffer layer 161 may include a double layer of SiNx/SiOX.

The first and second semiconductor layers 150a and 150b may be disposed on the buffer layer 161. The first semiconductor layer 150a may be disposed in the transistor region TRR to form a channel of the driving transistor DTR, and the second semiconductor layer 150b may also be disposed in the transistor region TRR to form a channel of the switching transistor STR. The first and second semiconductor layers 150a and 150b may include an oxide semiconductor. The oxide semiconductor may include at least one of, for example, a binary compound (ABx), a ternary compound (ABxCy), or a quaternary compound (ABxCyDz) including indium, zinc, gallium, tin, titanium, aluminum, hafnium (Hf), zirconium (Zr), magnesium (Mg) and the like. In an embodiment, the first semiconductor layer 150a and the second semiconductor layer 150b may include indium tin zinc oxide (IGZO).

The gate insulating layer 162 may be disposed on the first semiconductor layer 150a and the second semiconductor layer 150b. The gate insulating layer 162 may be formed in the same pattern as the gate conductive layer 130 as will be described later. Sidewalls of the gate insulating layer 162 may be substantially aligned with sidewalls of the gate conductive layer 130, but the disclosure is not limited thereto. The gate insulating layer 162 may include a silicon compound, a metal oxide, or the like. For example, the gate insulating layer 162 may include silicon oxide, silicon nitride, silicon oxynitride, aluminum oxide, tantalum oxide, hafnium oxide, zirconium oxide, titanium oxide, or the like. In an embodiment, the gate insulating layer 162 may include a SiOx layer.

The gate conductive layer 130 may be disposed on the gate insulating layer 162. The first gate electrode 131 of the driving transistor DTR and the second gate electrode 132 of the switching transistor STR may be formed of the gate conductive layer 130. Further, the scan line SCL may be formed of the gate conductive layer 130.

The gate conductive layer 130 may include a single layer or multiple layers. For example, the gate conductive layer 130 may include a gate main metal layer 131a and may further include a gate base layer 131b disposed under the gate main metal layer 131a. The gate main metal layer 131a and the gate base layer 131b may both be formed of a conductive material. The gate main metal layer 131a and the gate base layer 131b may be patterned in a mask process. In an embodiment, the sidewalls of the constituent layers of the gate conductive layer 130 may be aligned with each other. In some embodiments, in the constituent layers of the gate conductive layer 130, the sidewall of the upper layer may not protrude outward from the sidewall of the lower layer. The gate conductive layer 130 may not have a tip structure in which the upper layer protrudes. In the embodiments, in the gate conductive layer 130, the sidewall of the lower-positioned layer may be aligned with or protrude outward from the sidewall of the upper-positioned layer. An insulating layer may not be disposed between the constituent layers of the gate conductive layer 130 overlapping each other in the thickness direction.

The gate base layer 131b may contribute a film forming property, such as adhesion of the gate main metal layer 131a, or may prevent a reactive material from entering the gate main metal layer 131a, from the lower gate insulating layer 162. The gate base layer 131b may prevent a material (e.g., copper) forming the gate main metal layer 131a from diffusing to the adjacent lower layer. The gate base layer 131b may include a material such as titanium (Ti), tantalum (Ta), calcium (Ca), chromium (Cr), magnesium (Mg), nickel (Ni) and the like, but the disclosure is not limited thereto.

The gate main metal layer 131a may transmit a signal and may be formed of a low resistance material. The gate main metal layer 131a may have a greater thickness than the gate base layer 131b and may be formed of a material having a lower resistance than the gate base layer 131b. The gate main metal layer 131a may include a material such as copper (Cu), molybdenum (Mo), aluminum (Al), silver (Ag) and the like, but the disclosure is not limited thereto.

In an embodiment, the gate conductive layer 130 may include the gate base layer 131b containing titanium and the gate main metal layer 131a containing copper. The gate conductive layer 130 may include a double layer of Ti/Cu.

The interlayer insulating layer 163 may be disposed on the gate conductive layer 130. The interlayer insulating layer 163 may include an inorganic insulating material such as silicon oxide, silicon nitride, silicon oxynitride, hafnium oxide, aluminum oxide, titanium oxide, tantalum oxide, zinc oxide and the like. In an embodiment, the interlayer insulating layer 163 may include silicon oxyniride (SiON). Although the top surface of the interlayer insulating layer 163 is illustrated in the drawing (e.g., FIG. 5) as a flat surface for simplicity of description, the interlayer insulating layer 163 formed of the inorganic material may have a surface shape reflecting stepped lower portions.

In the interlayer insulating layer 163, the first contact hole CNT1 exposing the lower metal layer 120, the second contact hole CNT2 exposing a portion of the first semiconductor layer 150a, the third contact hole CNT3 exposing the data line DTL, the fourth contact hole CNT4 exposing a portion of the second semiconductor layer 150b, a fifth contact hole CNT5 exposing another portion of the second semiconductor layer 150b, and a sixth contact hole CNT6 exposing the first gate electrode 131 may be disposed. The first contact hole CNT1 may penetrate through the buffer layer 161 disposed under the interlayer insulating layer 163 to expose the lower metal layer 120, and the sixth contact hole CNT6 may penetrate through the buffer layer 161 disposed under the interlayer insulating layer 163 to expose the data line DTL.

The via layer 165 may be provided on the interlayer insulating layer 163. The via layer 165 may be disposed to cover the top surface of the interlayer insulating layer 163. The via layer 165 may include an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB). The via layer 165 may further include a photosensitive material, but the disclosure is not limited thereto. In an embodiment, the via layer 165 may include polyimide.

In the via layer 165, the first via hole VIA1, the second via hole VIA2, the third via hole VIA3, the fourth via hole VIA4, a fifth via hole VIA5 and a sixth via hole VIA6 may be disposed. The first to sixth via holes VIA1 to VIA6 may be formed to expose the first to sixth contact holes CNT1 to CNT6, respectively.

The first to sixth contact holes CNT1 to CNT6 may respectively overlap the first to sixth via holes VIA1 to VIA6. The first via hole VIA1 may overlap the first contact hole CNT1. The first contact hole CNT1 may completely overlap the first via hole VIA1. The second via hole VIA2 may overlap the second contact hole CNT2. The second contact hole CNT2 may completely overlap the second via hole VIA1. The third via hole VIA3 may overlap the third contact hole CNT3. The third contact hole CNT3 may completely overlap the third via hole VIA3. The fourth via hole VIA4 may overlap the fourth contact hole CNT4. The fourth contact hole CNT4 may completely overlap the fourth via hole VIA4. The fifth via hole VIA5 may overlap the fifth contact hole CNT5. The fifth contact hole CNT5 may completely overlap the fifth via hole VIA5. The sixth via hole VIA6 may overlap the sixth contact hole CNT6. The sixth contact hole CNT6 may completely overlap the sixth via hole VIA6.

Here, the first to sixth contact holes CNT1 to CNT6 may completely overlap the first to sixth via holes VIA1 to VIA6, respectively, in a structure where the top surface of the interlayer insulating layer 163 is exposed and the top surface surrounds the periphery of each contact hole overlapping each via hole.

Referring to FIGS. 6 and 7, the first via hole VIA1 may be disposed in the via layer 165, and the first contact hole CNT1 may be disposed in the interlayer insulating layer 163. The first contact hole CNT1 overlapping the first via hole VIA1 may be exposed through the first via hole VIA1. The interlayer insulating layer 163 may include a first top surface SF1 which is exposed through the first via hole VIA1 and faces the via layer 165. The first contact hole CNT1 and the first top surface SF1 of the interlayer insulating layer 163 which surrounds the first contact hole CNT1 may be exposed through the first via hole VIA1.

An inner peripheral surface INS1 of the first via hole VIA1 and an inner peripheral surface INS2 of the first contact hole CNT1 may not be in contact with each other to be spaced apart from each other. The first top surface SF1 of the interlayer insulating layer 163 may be disposed between the inner peripheral surface INS1 of the first via hole VIA1 and the inner peripheral surface INS2 of the first contact hole CNT1. The first top surface SF1 of the interlayer insulating layer 163 may be a surface that does not overlap the via layer 165 in the first via hole VIA1. The interlayer insulating layer 163 may include a second top surface SFF1 contacting the via layer 165. A step may be formed between the via layer 165 and the interlayer insulating layer 163 in a region where the first via hole VIA1 and the first contact hole CNT1 overlap each other.

On a plane (or an interface) where the via layer 165 and the interlayer insulating layer 163 contact each other, i.e., the first top surface SF1 of the interlayer insulating layer 163, a diameter d1 of the first via hole VIA1 may be greater than a diameter d2 of the first contact hole CNT1. In the structure that the first via hole VIA1 and the first contact hole CNT1 may overlap each other, since the diameter d1 of the first via hole VIA1 is greater than the diameter d2 of the first contact hole CNT1 on the interface, the first contact hole CNT1 may be completely overlapped with the first via hole VIA1 in plan view.

The pixel electrode PXE may be disposed on (or in contact with) the top surface of the via layer 165, the inner peripheral surface INS1 of the first via hole VIA1, the first top surface SF1 of the interlayer insulating layer 163, and the inner peripheral surface INS2 of the first contact hole CNT1. The pixel electrode PXE may be in contact with the first top surface SF1 of the interlayer insulating layer 163 exposed through the first via hole VIA1, so that a step coverage of the pixel electrode PXE formed along the first via hole VIA1 and the first contact hole CNT1 can be satisfactorily formed, thereby preventing a short circuit.

The inner peripheral surface INS1 of the first via hole VIA1 may have a first taper angle $\theta 1$ with respect to the second top surface SFF1 of the interlayer insulating layer 163. The inner peripheral surface INS2 of the first contact hole CNT1 may have a second taper angle $\theta 2$ with respect to a top surface SF2 of the buffer layer 161. Here, the first taper angle $\theta 1$ may be smaller than the second taper angle $\theta 2$. Accordingly, the step coverage of the pixel electrode PXE formed along the first via hole VIA1 and the first contact hole CNT1 can be formed with satisfaction, thereby preventing the short circuit. The first taper angle $\theta 1$ may be equal to or greater than about 30 degrees and equal to or less than about 60 degrees, and the second taper angle $\theta 2$ may be equal to or greater than about 60 degrees and equal to or less than about 80 degrees.

FIGS. 6 and 7 illustrate the first via hole VIA1 and the first contact hole CNT1 overlapping the first via hole VIA1 as an example, but the embodiment is not limited thereto. In the embodiment, the above-described structure may be also applied between the second via hole VIA2 and the second contact hole CNT2 overlapping the second via hole VIA2. Without being limited thereto, the same structure may also be applied between the third via hole VIA3 and the third contact hole CNT3 overlapping the third via hole VIA3, the fourth via hole VIA4 and the fourth contact hole CNT4 overlapping the fourth via hole VIA4, the fifth via hole VIA5 and the fifth contact hole CNT5 overlapping the fifth via hole VIA5 and the sixth via hole VIA6 and the sixth contact hole CNT6 overlapping the sixth via hole VIA6.

The via layer 165 may have a surface roughness ranging from about 0.1 nm to about 2 nm. The pixel electrode PXE described above may be disposed directly on the via layer 165. In case that the via layer 165 has a surface roughness, the surface roughness of the pixel electrode PXE also may occur because the pixel electrode PXE is formed on the surface of the via layer 165 along the surface thereof. As the surface roughness of the pixel electrode PXE increases, light may be reflected and/or diffused, thereby reducing light efficiency. Thus, in case that the via layer 165 has the surface roughness ranging from about 0.1 nm to about 2 nm, the light efficiency may be prevented from being reduced.

Referring back to FIG. 5, a transparent conductive layer 190 may be disposed on the via layer 165. The pixel electrode PXE, a first bridge electrode BRE1, and a second bridge electrode BRE2 may be formed of the transparent conductive layer 190. Materials forming the pixel electrode PXE, the first bridge electrode BRE1, and the second bridge electrode BRE2 may be the same as those described with reference to FIG. 2. In an embodiment, the pixel electrode PXE, the first bridge electrode BRE1, and the second bridge electrode BRE2 may include a triple layer of ITO/Ag/ITO.

The pixel electrode PXE may overlap the transistor region TRR, but the disclosure is not limited thereto. The pixel electrode PXE may be electrically connected to the lower metal layer 120 through the first via hole VIA1 penetrating the via layer 165 and the first contact hole CNT1 penetrating the interlayer insulating layer 163 and the buffer layer 161. Further, the pixel electrode PXE may be electrically connected to a portion of the first semiconductor layer 150a of the driving transistor DTR through the second via hole VIA2 penetrating the via layer 165 and the second contact hole CNT2 penetrating the interlayer insulating layer 163.

The first bridge electrode BRE1 may be spaced apart from the pixel electrode PXE, a portion of the first bridge electrode BRE1 may overlap the transistor region TRR and another portion of the first bridge electrode BRE1 may not overlap the transistor region TRR. The first bridge electrode BRE1 may be electrically connected to the data line DTL through the third via hole VIA3 penetrating the via layer 165 and the third contact hole CNT3 penetrating the interlayer insulating layer 163 and the buffer layer 161. The first bridge electrode BRE1 may be electrically connected to a portion of the second semiconductor layer 150b of the switching transistor STR through the fourth via hole VIA4 penetrating the via layer 165 and the fourth contact hole CNT4 penetrating the interlayer insulating layer 163. A portion of the first bridge electrode BRE1 overlapping the third via hole VIA3 may not overlap the transistor region TRR, and another portion of the first bridge electrode BRE1 overlapping the fourth via hole VIA4 may overlap the transistor region TRR.

The second bridge electrode BRE2 may be spaced apart from the pixel electrode PXE and the first bridge electrode BRE1 to overlap the transistor region TRR. The second bridge electrode BRE2 may be electrically connected to another portion of the second semiconductor layer 150b of the switching transistor STR through the fifth via hole VIA5 penetrating the via layer 165 and the fifth contact hole CNT5 penetrating the interlayer insulating layer 163. Further, the second bridge electrode BRE2 may be electrically connected to the first gate electrode 131 of the driving transistor DTR through the sixth via hole VIA6 penetrating the via layer 165, and the sixth contact hole CNT6 penetrating the interlayer insulating layer 163.

The pixel defining layer PDL may be disposed on the pixel electrode PXE. A material forming the pixel defining layer PDL is as described with reference to FIG. 2. In an embodiment, the pixel defining layer PDL may include polyimide.

The pixel defining layer PDL may be disposed to overlap the edge portion of the pixel electrode PXE. The pixel defining layer PDL may be disposed on the first to sixth via holes VIA1 to VIA6 to be overlapped therewith. The pixel defining layer PDL may fill or completely fill internal spaces of the first to sixth via holes VIA1 to VIA6. The pixel defining layer PDL may also be disposed on the via layer 165 on which the pixel electrode PXE is not formed.

The light emitting layer EML may be disposed on the pixel electrode PXE. The common electrode CME may be disposed on the light emitting layer EML. Since descriptions on the light emitting layer EML and the common electrode CME are the same as those made with reference to FIG. 2, redundant descriptions will be omitted.

As described above, in the display device according to an embodiment, by using a hard mask layer, a separate mask process for forming via holes and contact holes is not necessitated. Accordingly, it is possible to reduce mask processes, and thus the process efficiency can be improved. Further, by using the hard mask layer, it is possible to prevent a surface roughness of the via layer from being increased during a dry etching process. Accordingly, light efficiency can be improved. Furthermore, by forming a step between the via hole and the contact hole or forming taper angles to be different, a transparent conductive layer may be more efficiently or effectively deposited in a subsequent process, thereby preventing a short circuit of the transparent conductive layer.

Figure 8:
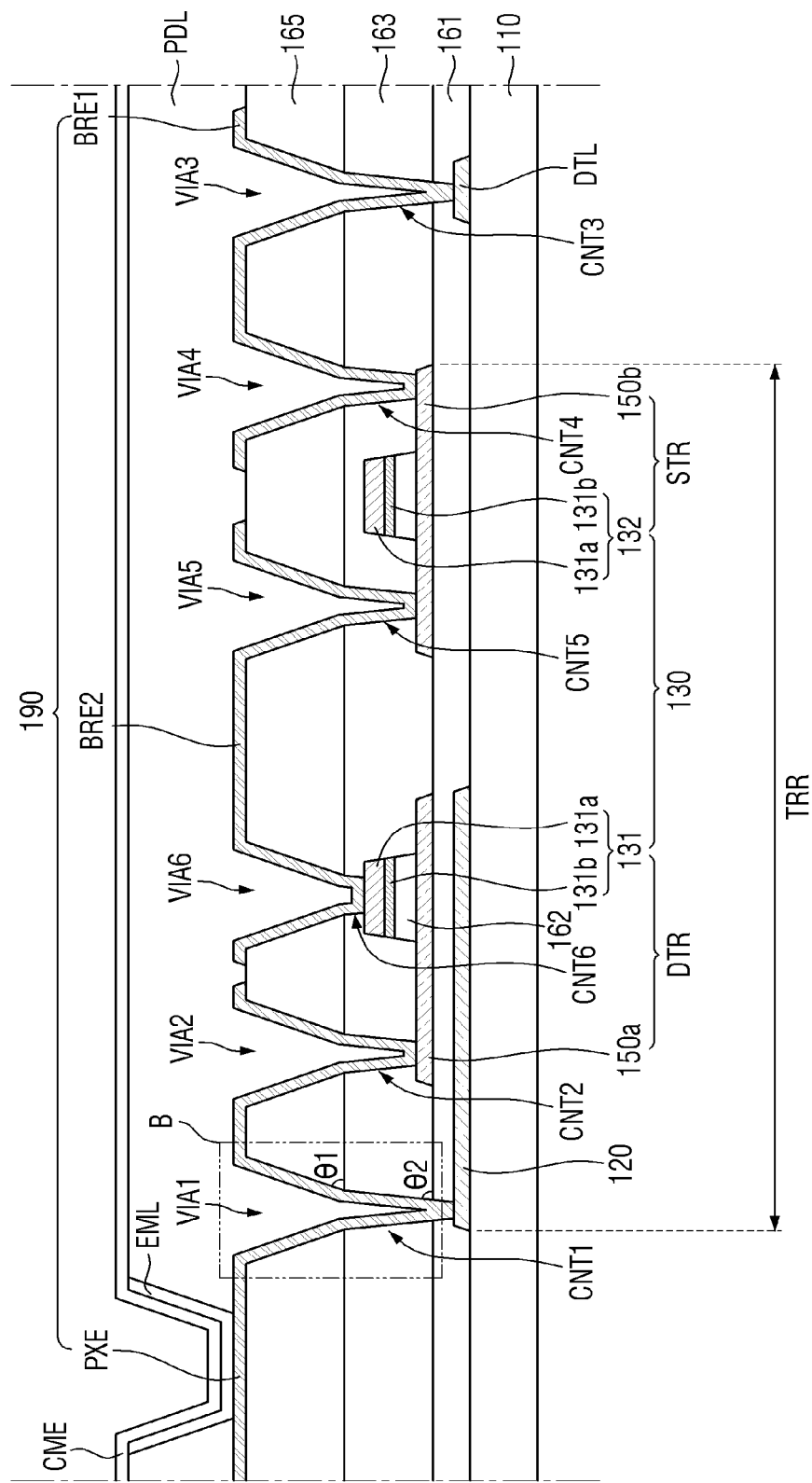
FIG. 8 is a schematic cross-sectional view of a first display substrate of a display device according to another embodiment.
Figure 9:
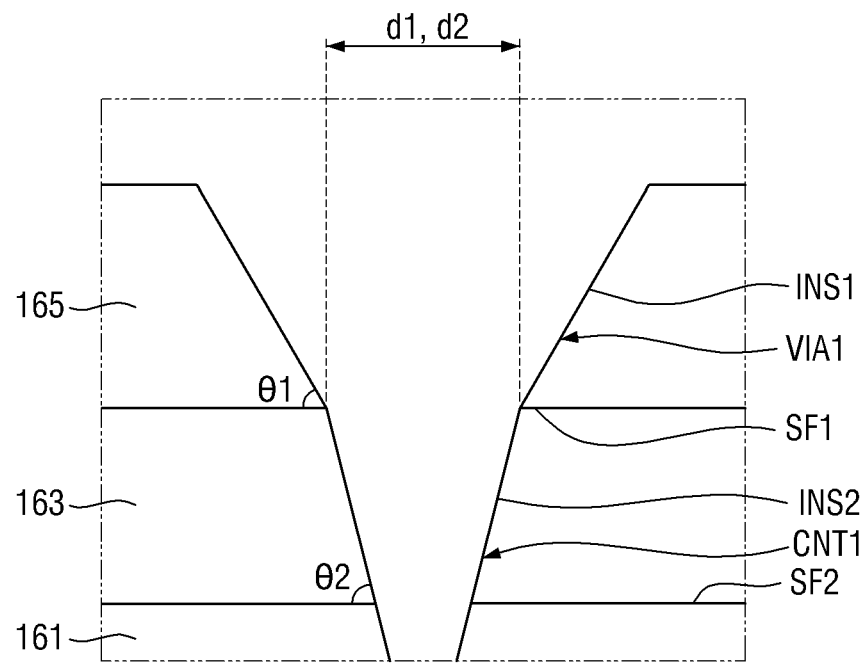
FIG. 9 is a schematic enlarged view of region B of FIG. 8.
Figure 10:
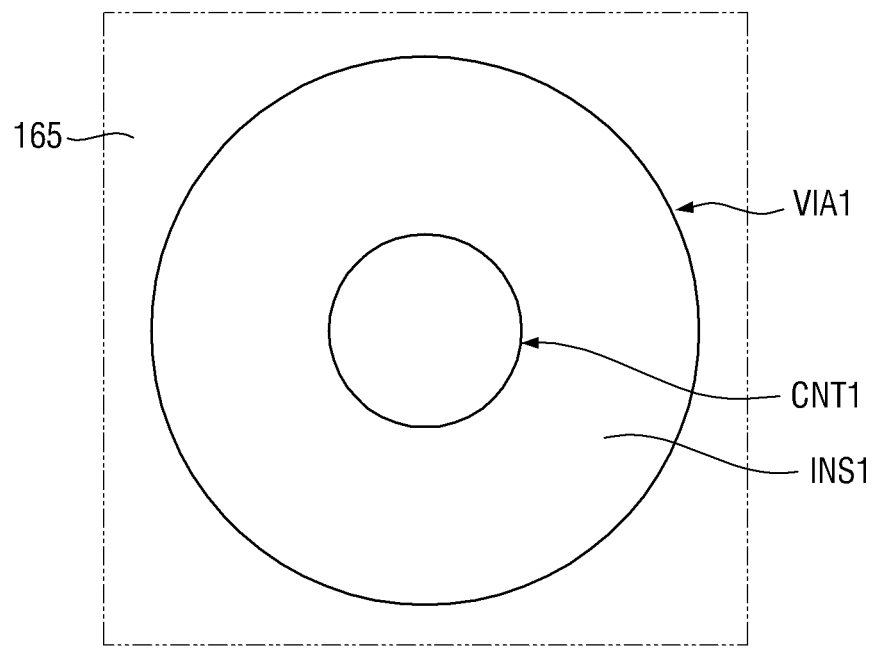
FIG. 10 is a schematic plan view of FIG. 9.

FIG. 8 is a schematic cross-sectional view of a first display substrate of a display device according to another embodiment. FIG. 9 is a schematic enlarged view of a region B of FIG. 8, and FIG. 10 is a schematic plan view of FIG. 9 when viewed from the above. The following describes the via layer and the interlayer insulating layer in the region where the via hole and the contact hole overlap with each other, which are different from those described above with reference to FIGS. 5 to 7, and a description on the same configurations will be omitted.

Referring to FIGS. 8 to 10, the first to sixth contact holes CNT1 to CNT6 may completely overlap the first to sixth via holes VIA1 to VIA6, respectively.

The first via hole VIA1 may be disposed in the via layer 165, and the first contact hole CNT1 may be disposed in the interlayer insulating layer 163. The first contact hole CNT1 overlapping the first via hole VIA1 may be exposed through the first via hole VIA1. The inner peripheral surface INS1 of the first via hole VIA1 and the inner peripheral surface INS2 of the first contact hole CNT1 may contact each other. The diameter d1 of the first via hole VIA1 may be the same as the diameter d2 of the first contact hole CNT1 on the plane (or interface) where the via layer 165 and the interlayer insulating layer 163 contact each other.

The first taper angle $\theta 1$ of the inner peripheral surface INS1 of the first via hole VIA1 may be smaller than the second taper angle $\theta 2$ of the inner peripheral surface INS2 of the first contact hole CNT1. The first taper angle $\theta 1$ may be equal to or greater than about 30 degrees and equal to or less than about 60 degrees, and the second taper angle $\theta 2$ may be equal to or greater than about 60 degrees and equal to or less than about 80 degrees.

As described above, the inner peripheral surface INS1 of the first via hole VIA1 and the inner peripheral surface INS2 of the first contact hole CNT1 may be in contact with each other, and the first taper angle $\theta 1$ of the inner peripheral surface INS1 of the first via hole VIA1 may be smaller than the second taper angle $\theta 2$ of the inner peripheral surface INS2 of the first contact hole CNT1. Accordingly, the pixel electrode PXE may be formed in contact with the inner peripheral surface INS1 of the first via hole VIA1 and the inner peripheral surface INS2 of the first contact hole CNT1 so that the step coverage can be satisfactorily formed, thereby preventing a short circuit.

In the description with reference to FIGS. 9 and 10, the first via hole VIA1 and the first contact hole CNT1 overlapping the first via hole VIA1 are illustrated as an example, but other embodiments are not limited thereto. In another embodiment, the above-described structure may be also applied between the second via hole VIA2 and the second contact hole CNT2 overlapping the second via hole VIA2. Without being limited thereto, the same structure may also be applied between the third via hole VIA3 and the third contact hole CNT3 overlapping the third via hole VIA3, the fourth via hole VIA4 and the fourth contact hole CNT4 overlapping the fourth via hole VIA4, the fifth via hole VIA5 and the fifth contact hole CNT5 overlapping the fifth via hole VIA5 and the sixth via hole VIA6 and the sixth contact hole CNT6 overlapping the sixth via hole VIA6.

The via layer 165 may have a surface roughness ranging from about 0.1 nm to about 2 nm. The pixel electrode PXE may be disposed directly on the via layer 165. In case that the via layer 165 has a surface roughness, the surface roughness of the pixel electrode PXE also may occur because the pixel electrode PXE is formed on the surface of the via layer 165 along the surface thereof. As the surface roughness of the pixel electrode PXE increases, light may be reflected and/or diffused, thereby reducing light efficiency. Thus, in case that the via layer 165 has the surface roughness ranging from about 0.1 nm to about 2 nm, the light efficiency is prevented from being reduced.

Hereinafter, a method for manufacturing the display device will be described.

FIGS. 11 to 19 are schematic cross-sectional views for explaining a method of manufacturing a display device (for example, the display device of FIG. 5) according to an embodiment.

Figure 11:
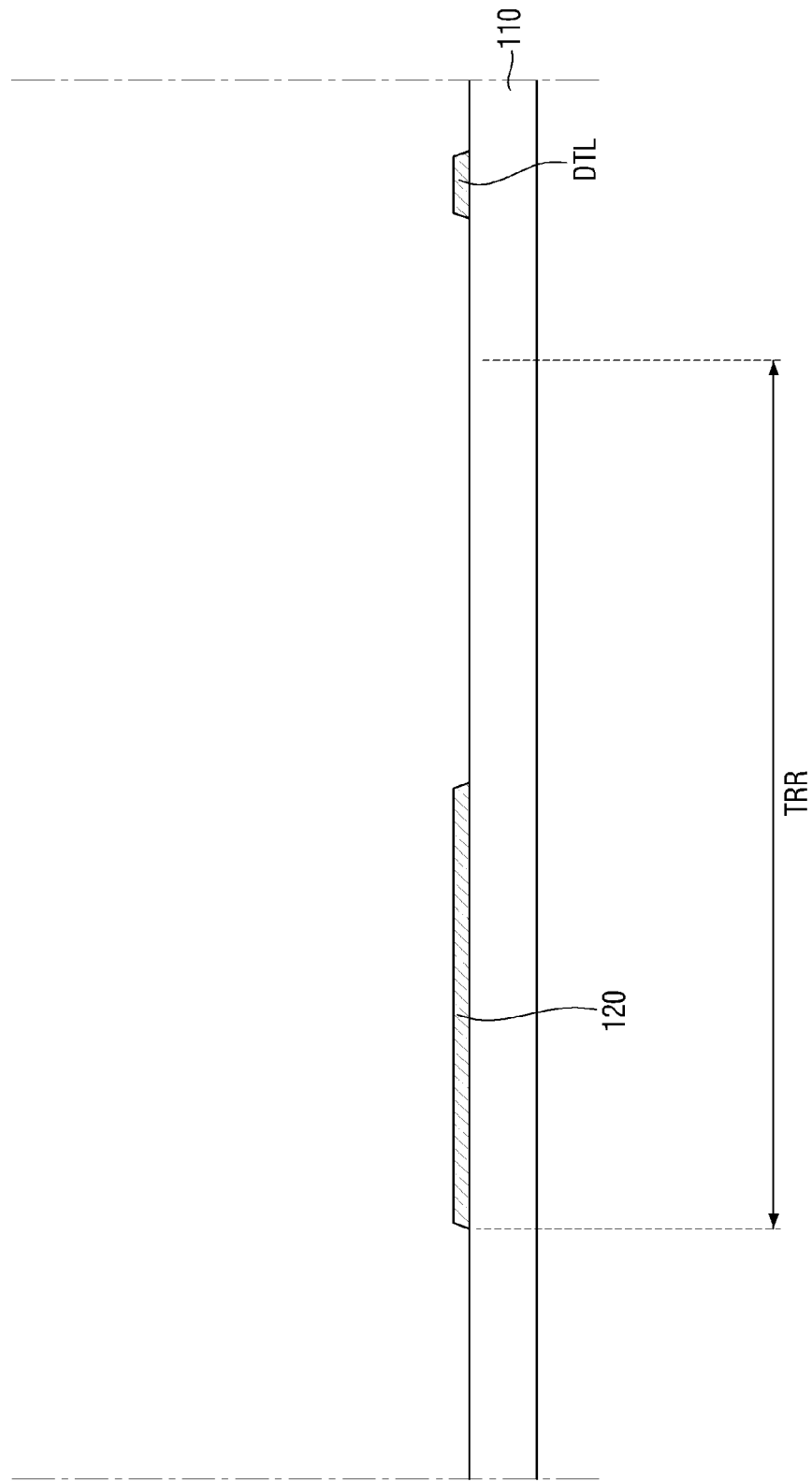
FIGS. 11 to 19 are schematic cross-sectional views for explaining a method of manufacturing a display device according to an embodiment.

Referring to FIG. 11, the patterned lower metal layer 120 and data line DTL may be formed on the first substrate 110. The patterned lower metal layer 120 and data line DTL may be formed through a mask process. For example, after depositing (or entirely depositing) a material layer for the lower metal layer on the first substrate 110, the material layer may be patterned through a photolithography process to form the lower metal layer 120 and the data line DTL as shown in FIG. 11.

Figure 12:
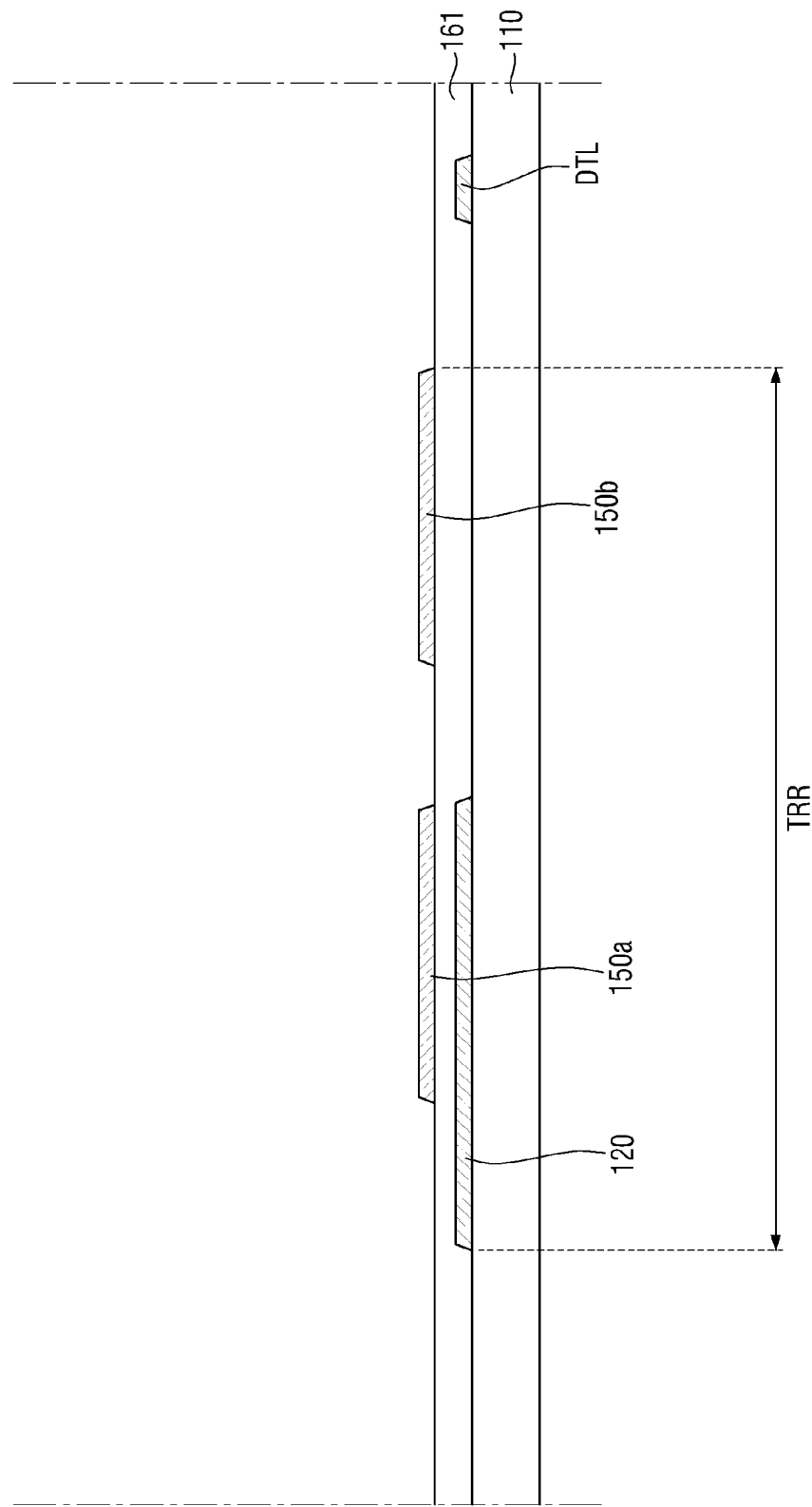

Referring to FIG. 12, the buffer layer 161 may be formed on the entire surface of the first substrate 110 on which the lower metal layer 120 and the data line DTL are formed. The first semiconductor layer 150a and the second semiconductor layer 150b may be formed on the buffer layer 161. The first semiconductor layer 150a and the second semiconductor layer 150b may be formed through a mask process. For example, an oxide semiconductor may be entirely deposited on the buffer layer 161 and patterned through a photolithography process to form the first semiconductor layer 150a and the second semiconductor layer 150b as shown in FIG. 12.

Figure 13:
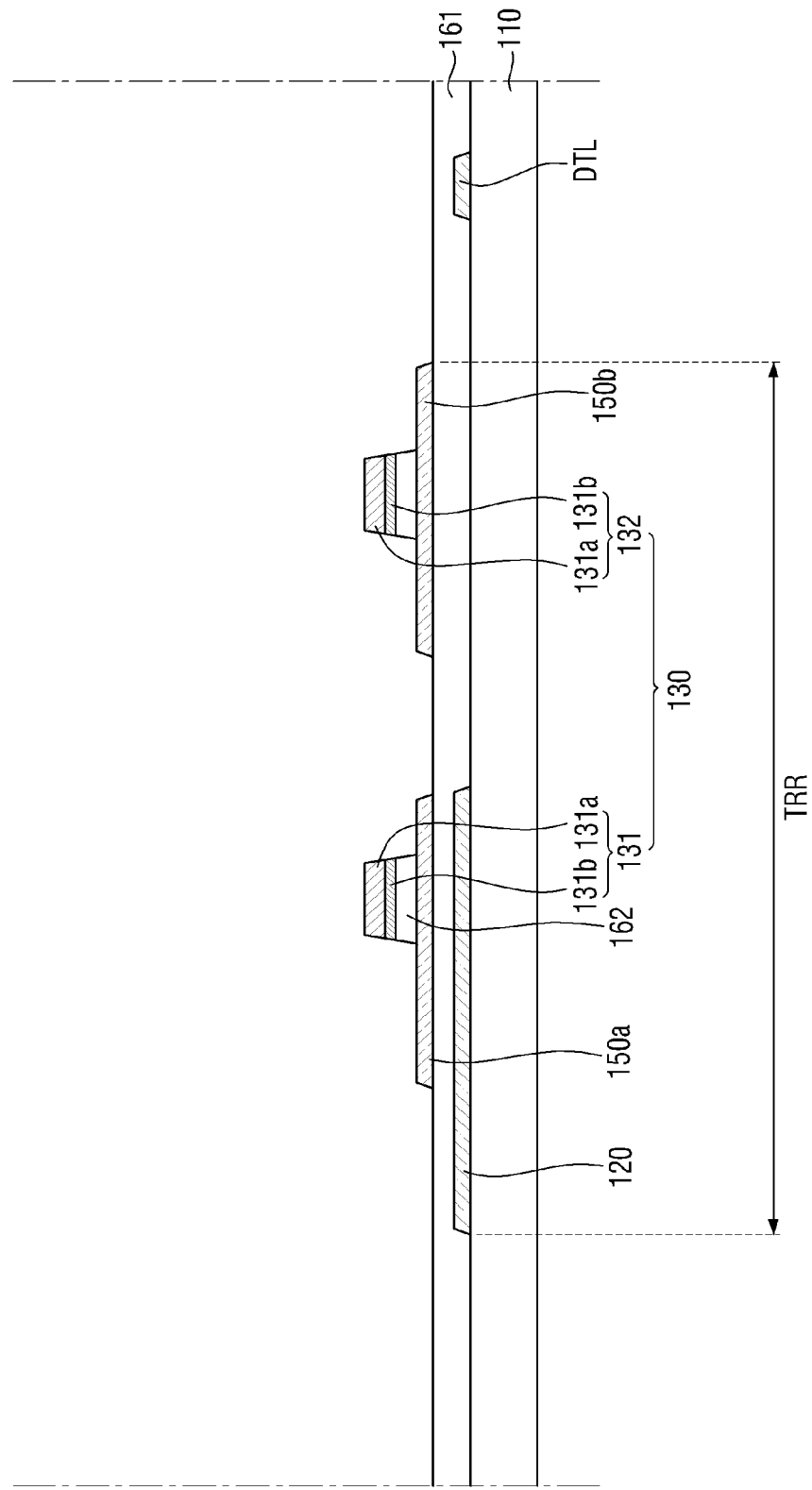

Referring to FIG. 13, the patterned gate insulating layer 162 and the patterned gate conductive layer 130 may be formed on the buffer layer 161 on which the first semiconductor layer 150a and the second semiconductor layer 150b are formed. The patterned gate conductive layer 130 may include the first gate electrode 131 overlapping the first semiconductor layer 150a and the second gate electrode 132 overlapping the second semiconductor layer 150b. The patterned gate insulating layer 162 and the patterned gate conductive layer 130 may be formed in a mask process. For example, a material layer for the gate insulating layer may be entirely deposited on the buffer layer 161 on which the first semiconductor layer 150a and the second semiconductor layer 150b are formed. A material layer for a first gate conductive metal layer and a material layer for a second gate conductive metal layer may be deposited on the material layer for the gate insulating layer. A photoresist layer may be coated on the material layer for the second gate conductive metal layer, and a photoresist pattern may be formed through exposure and development. By using the photoresist pattern as an etching mask, the material layer for the second gate conductive metal layer, the material layer for the first gate conductive metal layer, and the material layer for the gate insulating layer may be sequentially etched. The photoresist pattern may be removed through a strip process or an ashing process. In the above description, as an example, the photoresist pattern may be used as the etching mask until the gate insulating layer 162 is patterned. However, the patterned upper layer may be used as a hard mask for etching the lower layer. In this case, the photoresist pattern may be used as an etching mask together with the hard mask. As another example, after forming the hard mask, the photoresist pattern may be removed, and the lower layer may be etched by using the hard mask as an etching mask.

Figure 14:
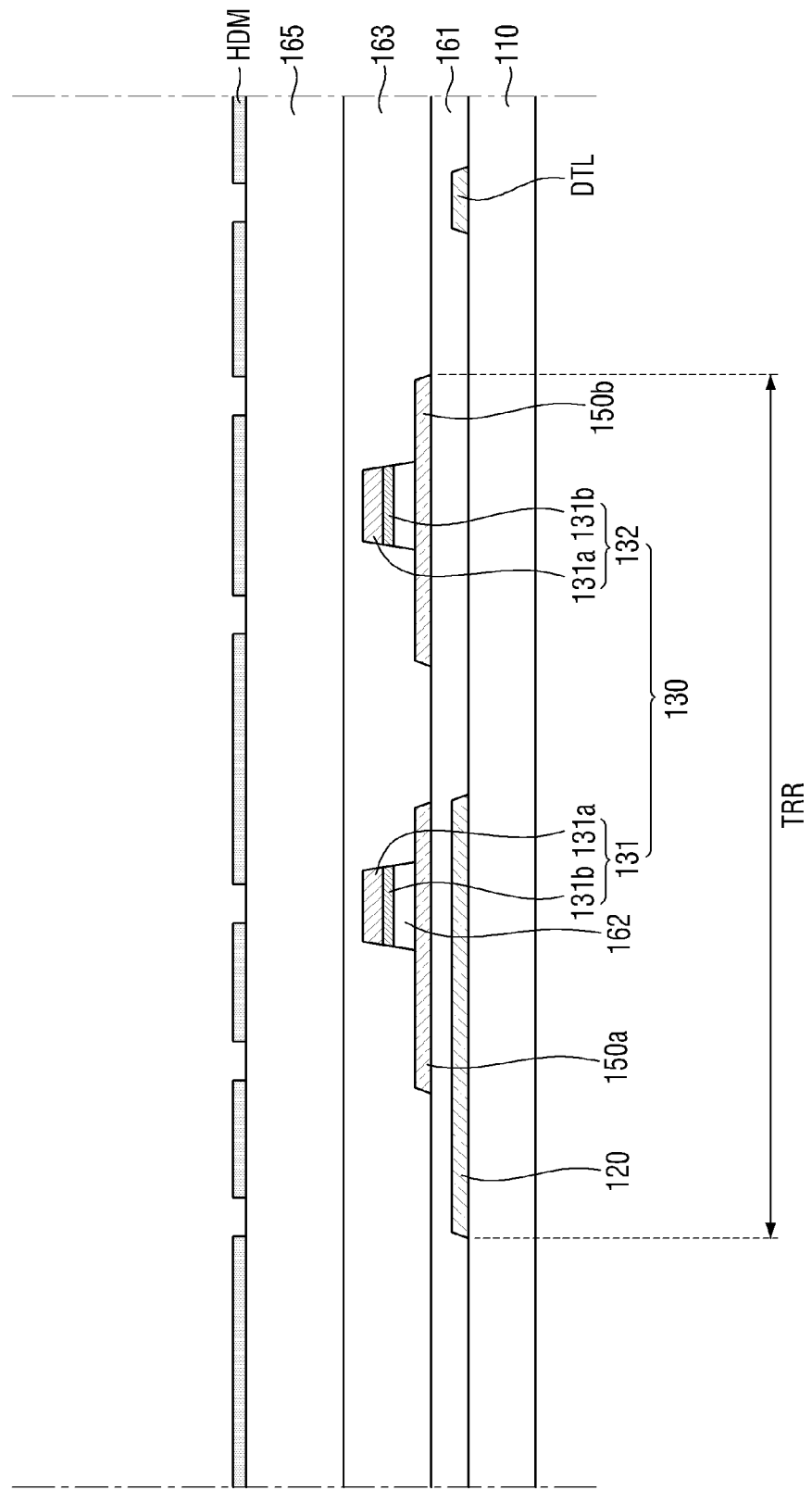

Referring to FIG. 14, the interlayer insulating layer 163 and the via layer 165 may be sequentially stacked on the buffer layer 161 on which the gate conductive layer 130 is formed. A patterned hard mask layer HDM may be formed on the via layer 165. The patterned hard mask layer HDM may be formed through a mask process. For example, a material layer for the hard mask may be entirely deposited on the via layer 165, and patterned through a photolithography process to form the patterned hard mask layer HDM as illustrated in FIG. 14. In an embodiment, the hard mask layer HDM may include a metal oxide. For example, the hard mask layer HDM may include at least one selected from the group of consisting of indium tin oxide (ITO), indium zinc oxide (IZO), indium gallium zinc oxide (IGZO), aluminum oxide (AlOx), zirconium oxide (ZrOx), and hafnium oxide (HfOx) or the like. However, a material may be used for forming the hard mask layer HDM as long as the material has a low etching rate during the etching process of the via layer, the interlayer insulating layer, and/or the buffer layer. In an embodiment, the hard mask layer HDM may be formed of IZO.

Figure 15:
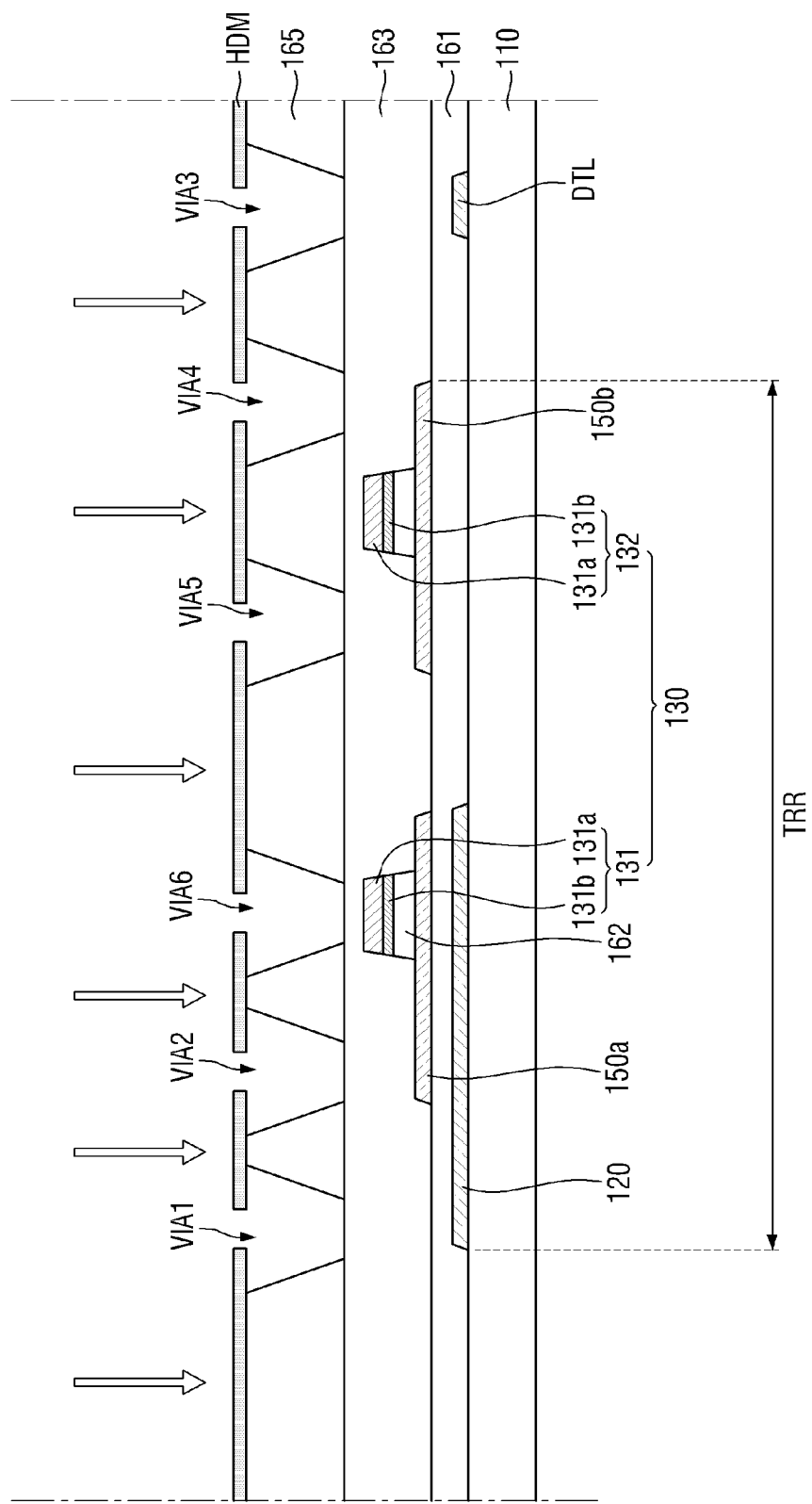

Referring to FIG. 15, the first to sixth via holes VIA1 to VIA6 may be formed in the via layer 165 by using the patterned hard mask layer HDM as an etching mask. The first to sixth via holes VIA1 to VIA6 may be formed through a dry etching process by using the patterned hard mask layer HDM as the etching mask. For example, the via layer 165 on which the patterned hard mask layer HDM is formed may be dry etched to form the first to sixth via holes VIA1 to VIA6 respectively exposing portions of the lower interlayer insulating layer 163. The dry etching process may be isotropic etching and performed by containing fluorine (F) and oxygen ($O_2$) in a reaction gas. Each of the first to sixth via holes VIA1 to VIA6 may be formed to have an undercut shape under the patterned hard mask layer HMD by the isotropic etching. The degree of the undercut, i.e., a distance between a side of the hard mask layer HMD and the inner peripheral surface of the via hole may be controlled by adjusting a pressure and power applied in the dry etching process. Therefore, the first to sixth via holes VIA1 to VIA6 may be formed as illustrated in FIG. 15.

In this step, the patterned hard mask layer HDM may protect the via layer 165 during the dry etching process, thereby preventing the surface roughness of the via layer 165 from being increased.

Figure 16:
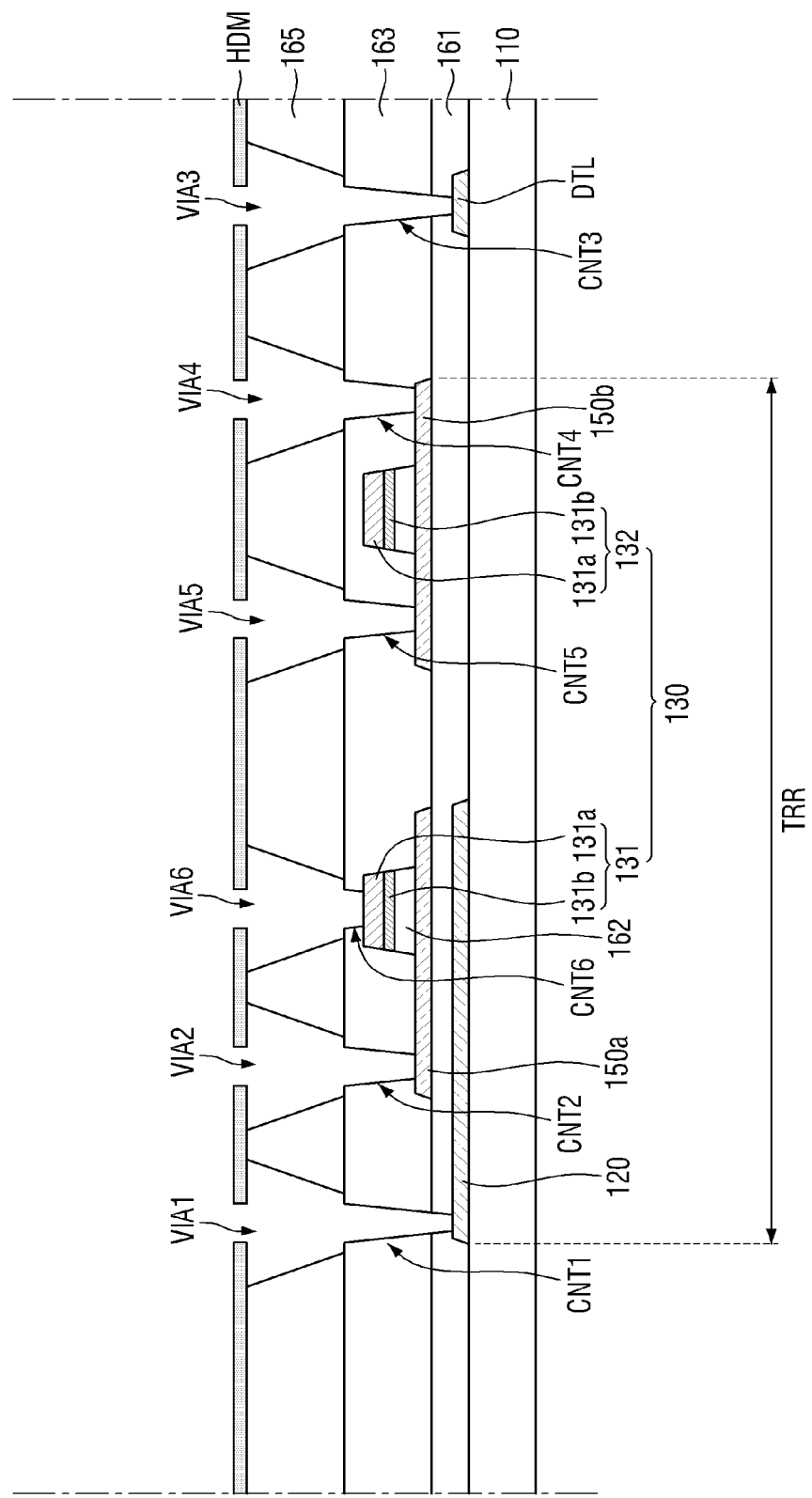

Referring to FIG. 16, the first to sixth contact holes CNT1 to CNT6 may be formed in the interlayer insulating layer 163 exposed through the first to sixth via holes VIA1 to VIA6 by using the patterned hard mask layer HDM as an etching mask. The first contact hole CNT1 may be formed by etching the interlayer insulating layer 163 and the buffer layer 161 exposed by the first via hole VIA1 and may expose the lower metal layer 120. The second contact hole CNT2 may be formed by etching the interlayer insulating layer 163 exposed by the second via hole VIA2, and may expose a portion of the first semiconductor layer 150a. The third contact hole CNT3 may be formed by etching the interlayer insulating layer 163 and the buffer layer 161 exposed by the third via hole VIA1 and may expose the data line DTL. The fourth contact hole CNT4 may be formed by etching the interlayer insulating layer 163 exposed by the fourth via hole VIA4 and may expose a portion of the second semiconductor layer 150b. The fifth contact hole CNT5 may be formed by etching the interlayer insulating layer 163 exposed by the fifth via hole VIA5 and may expose another portion of the second semiconductor layer 150b. The sixth contact hole CNT6 may be formed by etching the interlayer insulating layer 163 exposed by the sixth via hole VIA6 and may expose the first gate electrode 131.

The first to sixth contact holes CNT1 to CNT6 described above may be formed through a dry etching process by using the patterned hard mask layer HDM as the etching mask. For example, the first to sixth contact holes CNT1 to CNT6 may be formed by dry-etching the interlayer insulating layer 163 and/or the buffer layer 161 exposed under the patterned hard mask layer HDM. In the dry etching process, anisotropic etching is performed by increasing the content of fluorine (F) and reducing the content of oxygen ($O_2$) of the reaction gas. Each of the first to sixth contact holes CNT1 to CNT6 may be formed by adjusting etching process conditions such as anisotropic etching, reaction gas, pressure, and power to etch the interlayer insulating layer 163 and/or the buffer layer 161.

Due to the feature of the anisotropic etching, each region of the interlayer insulating layer 163 which is aligned with a side of the hard mask layer HDM may be etched to form the first to sixth contact holes CNT1 to CNT6. Thus, as shown in FIG. 16, the inner peripheral surface of the first via hole VIA1 and the inner peripheral surface of the first contact hole CNT1 may not be in contact with each other to be spaced apart from each other. A step may be formed between the via layer 165 and the interlayer insulating layer 163 in the region where the first via hole VIA1 and the first contact hole CNT1 overlap. Further, the diameter of the first via hole VIA1 may be larger than that of the first contact hole CNT1 on a plane where the via layer 165 and the interlayer insulating layer 163 contact each other. Due to the step between the via layer 165 and the interlayer insulating layer 163, it is possible to improve the step coverage during a deposition of the transparent conductive layer in a subsequent process.

Through the steps of forming the first to sixth via holes VIA1 to VIA6 and the first to sixth contact holes CNT1 to CNT6, the first taper angle θ1 of the inner peripheral surface INS1 of the first via hole VIA1 may be formed to be smaller than the second taper angle θ2 of the inner peripheral surface INS2 of the first contact hole CNT1. Accordingly, it is possible to improve the step coverage of the transparent conductive layer which is deposited in the subsequent process.

In this step, the patterned hard mask layer HDM may protect the via layer 165 from the dry etching, thereby preventing the occurrence of surface roughness of the via layer 165.

Figure 17:
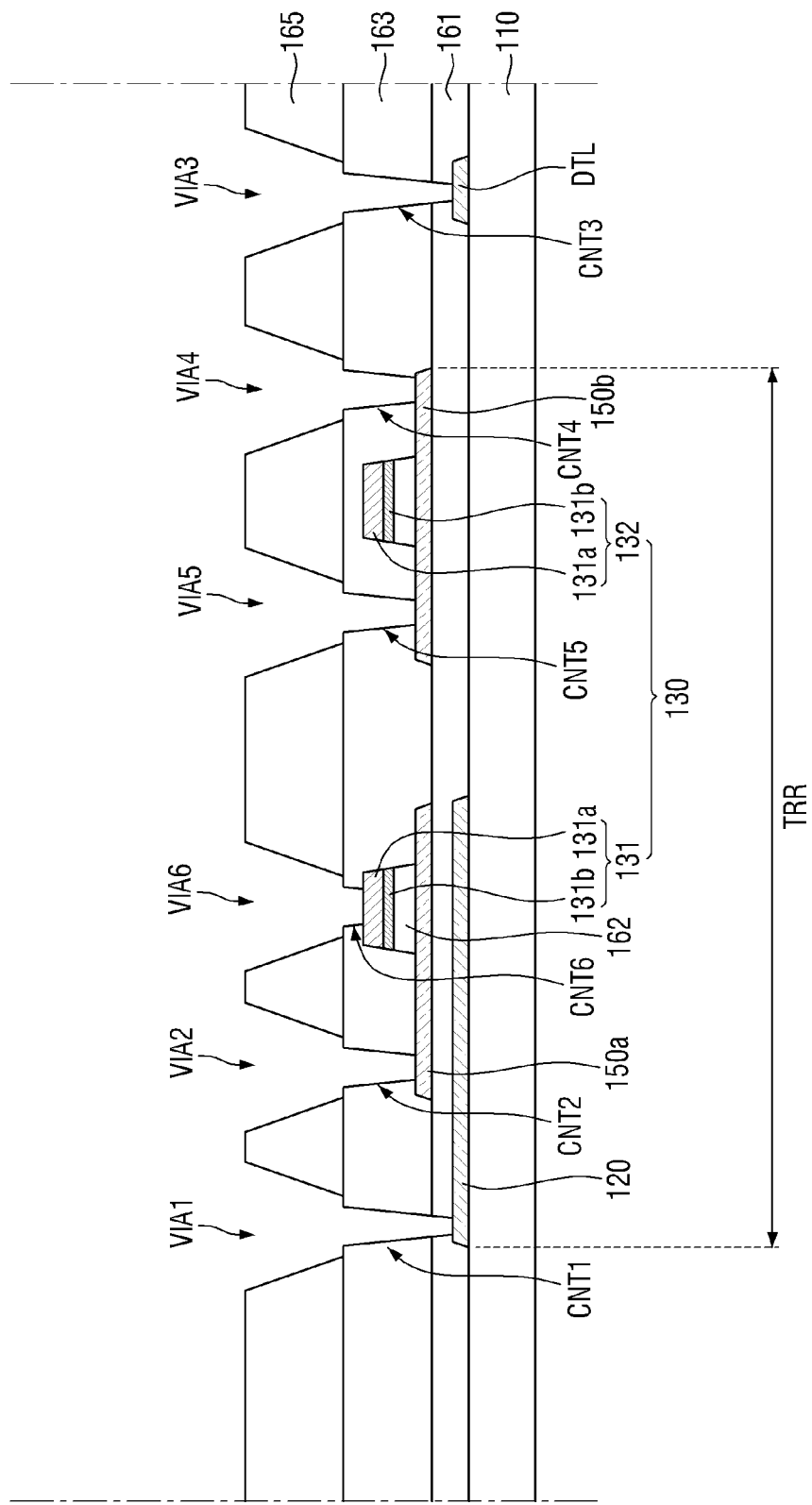

Referring to FIG. 17, the patterned hard mask layer HDM may be stripped and removed. The patterned hard mask layer HDM may be removed through a wet etching or dry etching process.

In an embodiment, the first to sixth via holes VIA1 to VIA6 and the first to sixth contact holes CNT1 to CNT6 penetrating the via layer 165, the interlayer insulating layer 163, and the buffer layer 161 may be formed by using the hard mask layer HDM. Accordingly, an additional mask process is not necessitated, and thus, the process efficiency can be improved.

Figure 18:
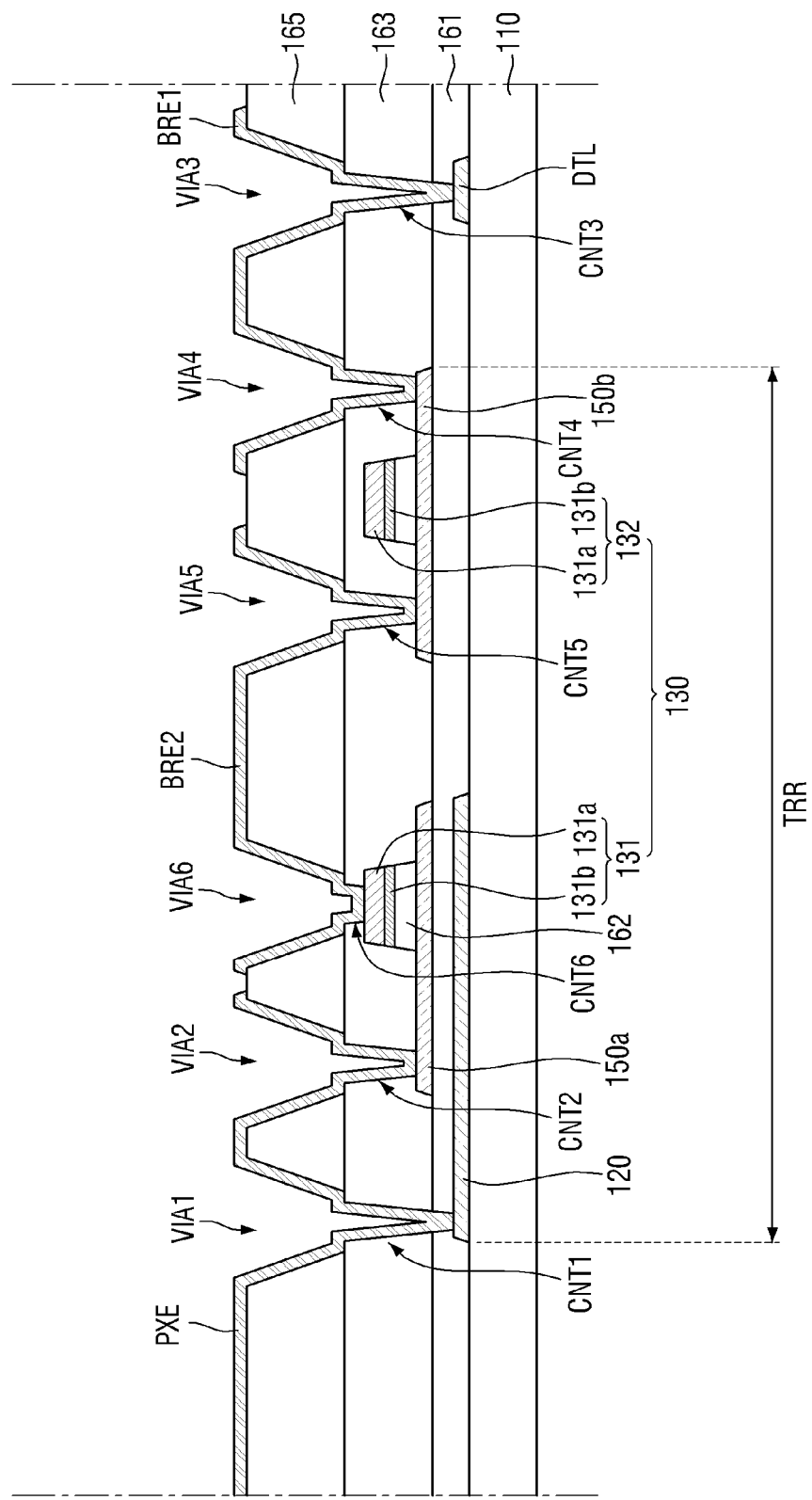

Referring to FIG. 18, the patterned pixel electrode PXE, the first bridge electrode BRE1, and the second bridge electrode BRE2 may be formed on the via layer 165. The patterned pixel electrode PXE, first bridge electrode BRE1, and second bridge electrode BRE2 may be formed through a mask process. For example, a material layer for the transparent conductive layer may be entirely deposited on the via layer 165. In the deposition process, the material layer may be deposited on the inner surfaces of the first to sixth via holes VIA1 to VIA6 and the first to sixth contact holes CNT1 to CNT6 to be electrically connected with the lower metal layer 120 and the first semiconductor layer 150a, the first gate electrode 131, the second semiconductor layer 150b, and the data line DTL, respectively.

The pixel electrode PXE may be electrically connected to the lower metal layer 120 through the first via hole VIA1 and the first contact hole CNT1, and may be electrically connected to a portion of the first semiconductor layer 150a through the second via hole VIA2 and the second contact hole CNT2. The first bridge electrode BRE1 may be electrically connected to the data line DTL through the third via hole VIA3 and the third contact hole CNT3, and may be electrically connected to a portion of the second semiconductor layer 150b through the fourth via hole VIA4 and the fourth contact hole CNT4. The second bridge electrode BRE2 may be electrically connected to another portion of the second semiconductor layer 150b through the fifth via hole VIA5 and the fifth contact hole CNT5, and may be electrically connected to the first gate electrode 131 through the sixth via hole VIA6 and the sixth contact hole CNT6.

A photoresist layer may be coated on the material layer for the transparent conductive layer, a photoresist pattern may be formed through exposure and development, and then the material layer may be etched by using the photoresist pattern as an etching mask. Thereafter, the photoresist pattern may be removed through a strip process or an ashing process to complete the patterned pixel electrode PXE, first bridge electrode BRE1, and second bridge electrode BRE2 as illustrated in FIG. 18.

Figure 19:
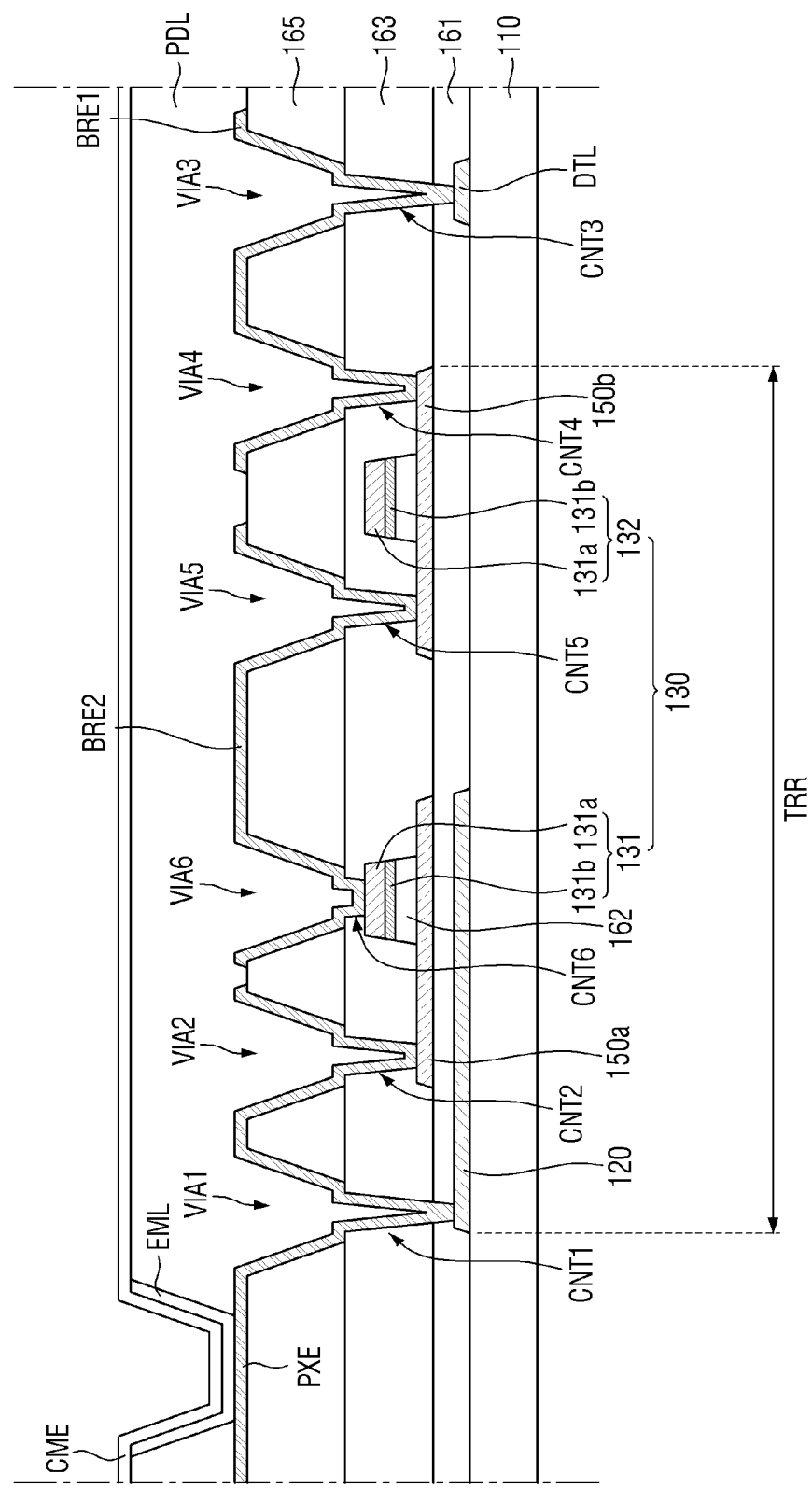

Referring to FIG. 19, the patterned pixel defining layer PDL may be formed on the via layer 165 on which the pixel electrode PXE, the first bridge electrode BRE1, and the second bridge electrode BRE2 are formed. The pixel defining layer PDL may include, e.g., an organic material having a photosensitive material. In this case, the patterned pixel defining layer PDL may be formed by coating an organic material layer for the pixel defining layer PDL, followed by exposure and development.

The light emitting layer EML may be formed on the first substrate 110 on which the pixel defining layer PDL is formed. The light emitting layer EML may be formed in a patterned shape by using a fine metal mask (FMM). The common electrode CME may be formed on the first substrate 110 on which the light emitting layer EML is formed. The common electrode CME may be formed to cover at least the display area of the first substrate 110 by using an open mask.

As described above, by using the hard mask layer HDM, a separate mask process for forming via holes and contact holes is not necessitated. Accordingly, it is possible to reduce mask processes, and thus the process efficiency can be improved. Further, by using the hard mask layer HDM, it is possible to prevent a surface roughness of the via layer 165 from being increased during a dry etching process. Accordingly, light efficiency can be improved.

Hereinafter, other embodiments will be described. In the following embodiments, a description of the same components as those of the above-described embodiment will be omitted or simplified to avoid redundancy, and differences will be mainly described.

FIGS. 20 to 24 are schematic cross-sectional views for explaining a method of manufacturing a display device (for example, the display device of FIG. 8) according to an embodiment.

The steps of forming, on the first substrate 110, the patterned lower metal layer 120, the patterned data line DTL, the buffer layer 161, the patterned first semiconductor layer 150a and second semiconductor layer 150b, the patterned gate insulating layer 162, the patterned first and second gate electrodes 131 and 132, the interlayer insulating layer 163, and the via layer 165 are the same as those of the embodiment of FIGS. 11 to 14.

Figure 20:
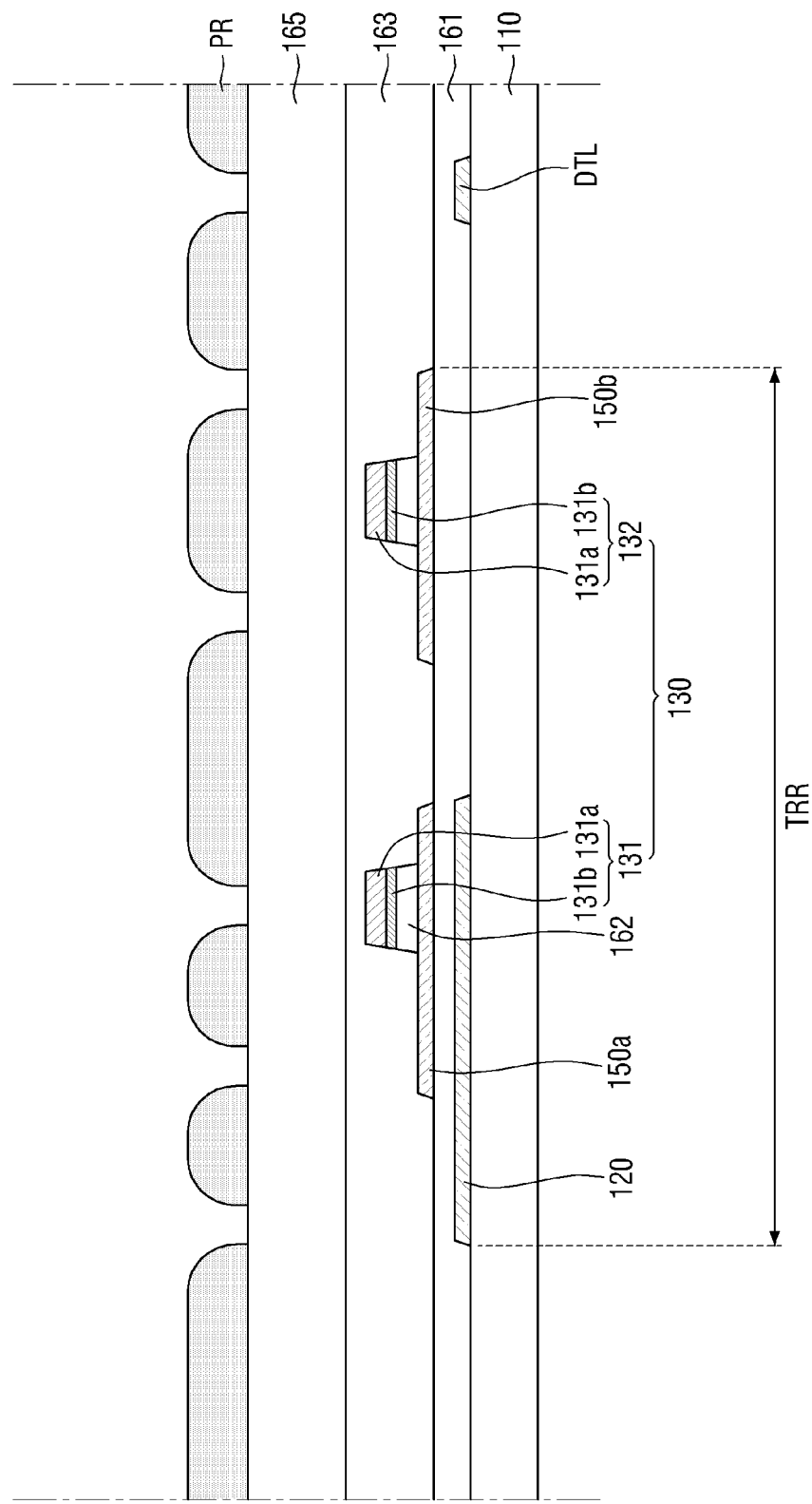
FIGS. 20 to 24 are schematic cross-sectional views for explaining a method of manufacturing a display device according to an embodiment.

Referring to FIG. 20, the photoresist pattern PR may be formed on the via layer 165. The photoresist pattern PR be employed in lieu of the hard mask layer HDM of FIG. 14.

Figure 21:
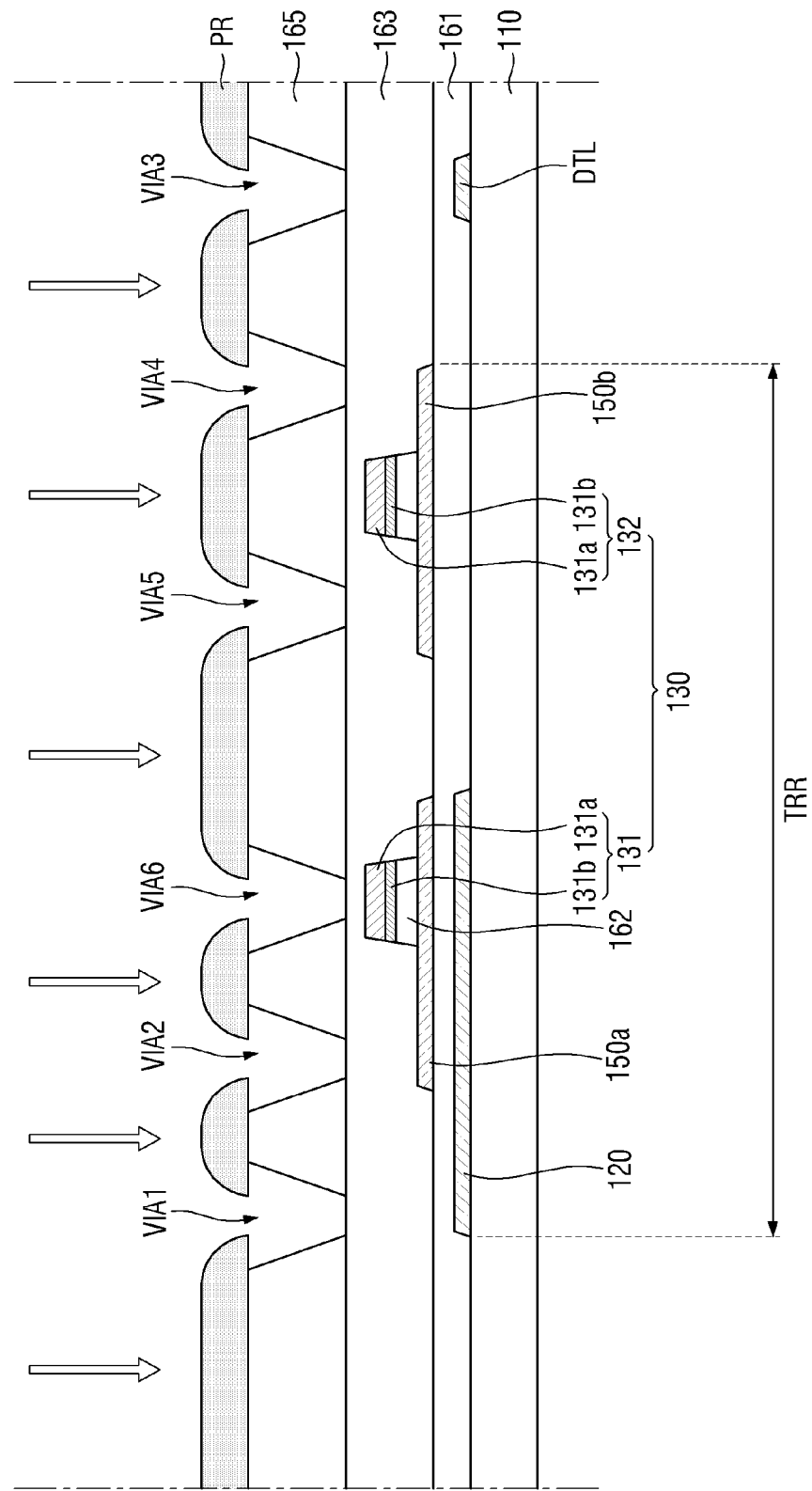

Referring to FIG. 21, the first to sixth via holes VIA1 to VIA6 may be formed in the via layer 165 using the photoresist pattern PR as an etching mask. During the dry etching process for forming the first to sixth via holes VIA1 to VIA6, the selectivity between the photoresist pattern PR and the via layer 165 may be adjusted to about 0.8 to about 1 and anisotropic etching may be performed. As a result, a side of the photoresist pattern PR may be in contact with a side of the via layer 165 having the via holes VIA1 to VIA6. The photoresist pattern PR may be reduced in size by the dry etching process.

Figure 22:
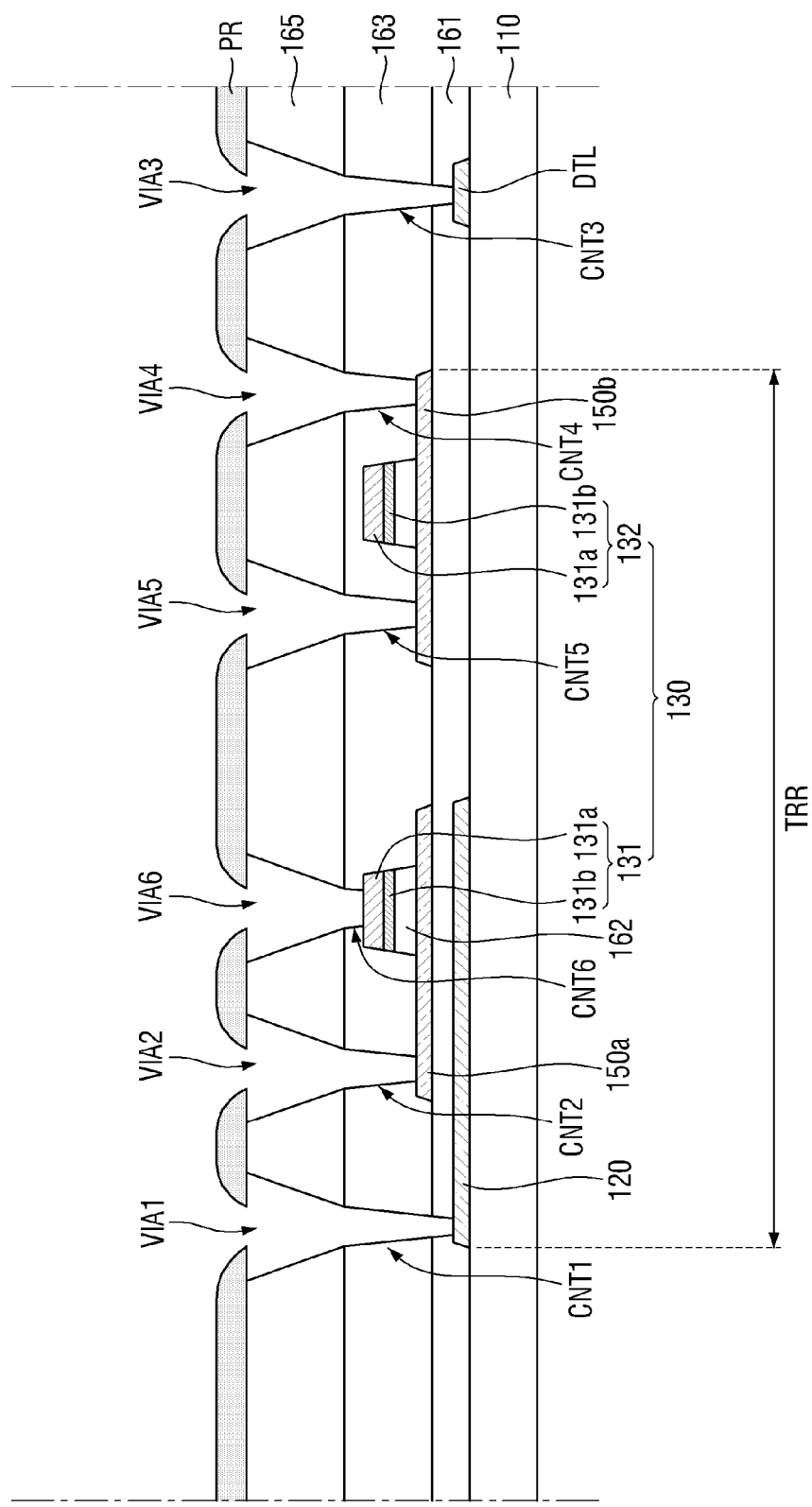

Referring to FIG. 22, the first to sixth contact holes CNT1 to CNT6 may be formed in the interlayer insulating layer 163 and/or the buffer layer 161 using the photoresist pattern PR as an etching mask. During the dry etching process for forming the first to sixth contact holes CNT1 to CNT6, the selectivity between the photoresist pattern PR and the via layer 165 is adjusted to about 0.7 to about 1.3 and anisotropic etching is performed. Accordingly, the inner peripheral surfaces of the via holes VIA1 to VIA6 and the inner peripheral surfaces of the contact holes CNT1 to CNT6 may be in contact with each other. The photoresist pattern PR may be reduced in size by the dry etching process.

Figure 23:
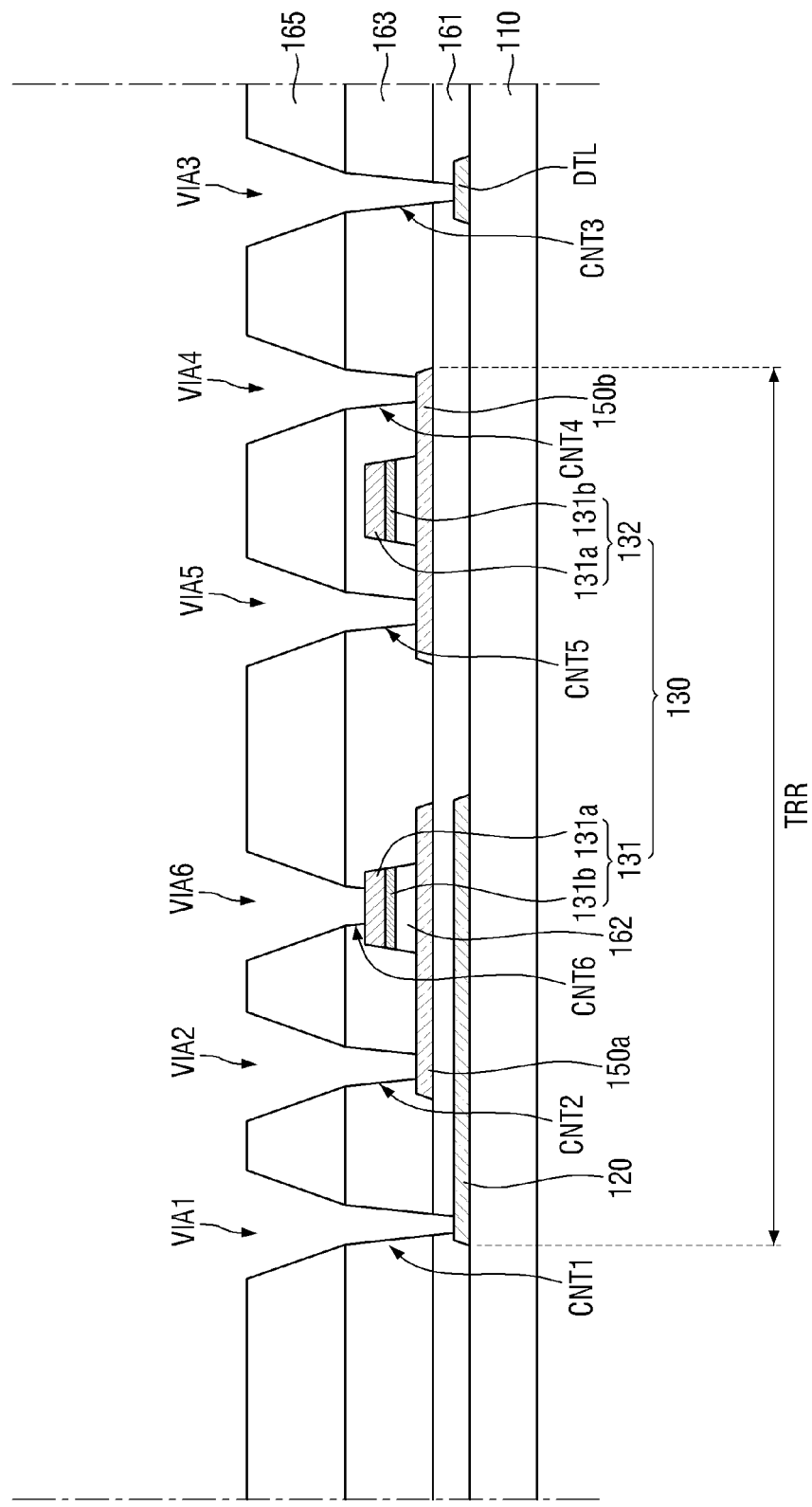

Referring to FIG. 23, the photoresist pattern PR may be removed by a strip or ashing process.

Through the above-described process, the inner peripheral surface INS1 of the first via hole VIA1 and the inner peripheral surface INS2 of the first contact hole CNT1 may contact each other (referring to FIG. 9). Since the first taper angle θ1 of the inner peripheral surface INS1 of the first via hole VIA1 is smaller than the second taper angle θ2 of the inner peripheral surface INS2 of the first contact hole CNT1, the pixel electrode PXE may be more efficiently or effectively deposited in the first via hole VIA1 and the first contact hole CNT1.

Figure 24:
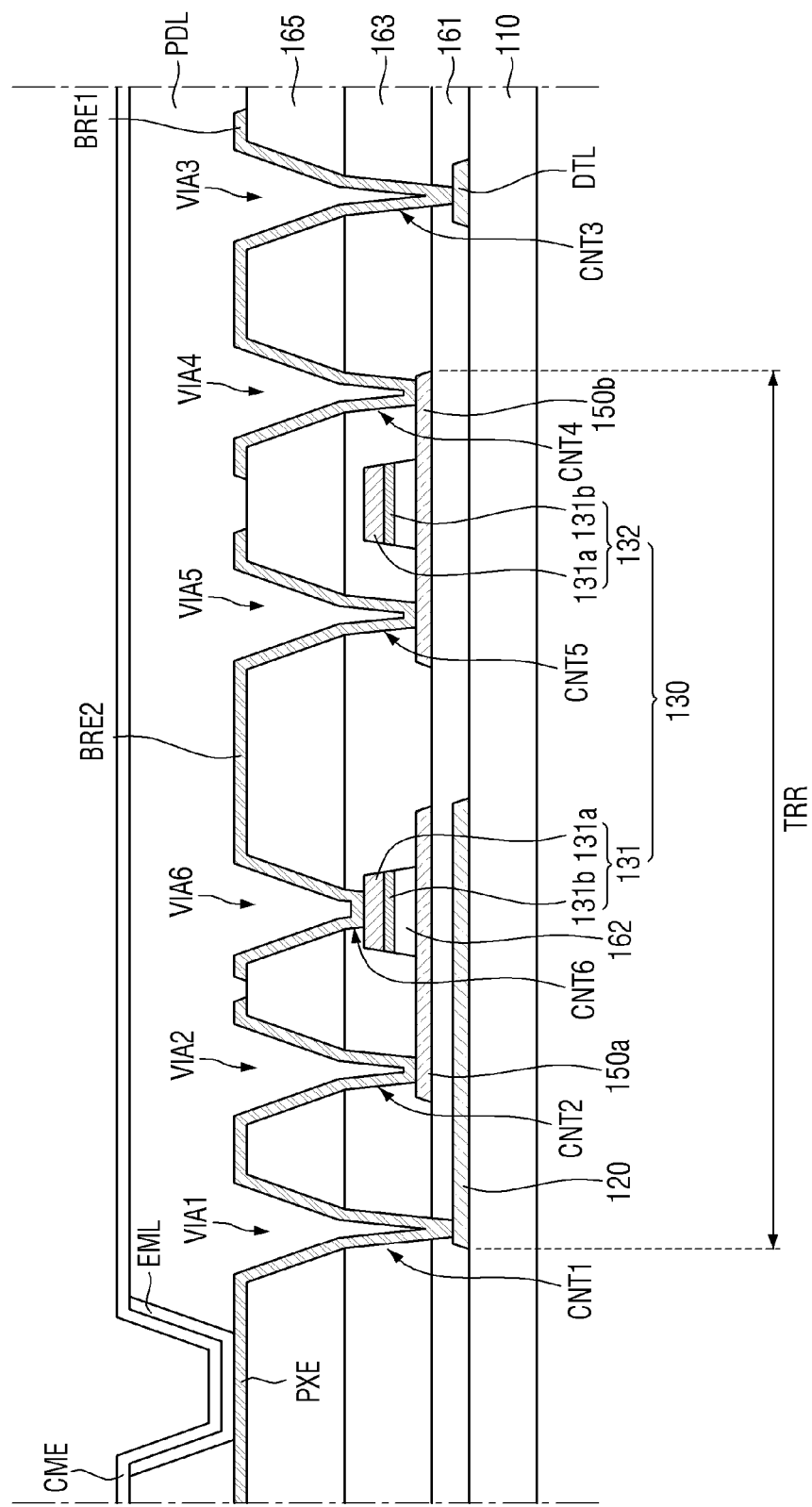

Referring to FIG. 24, in the same manner as in the above-described embodiment, the pixel electrode PXE, the first bridge electrode BRE1, the second bridge electrode BRE2, and the pixel defining layer PDL may be formed on the via layer 165. The emission layer EML may be formed on the pixel electrode PXE, and the common electrode CME may be formed on the emission layer EML and the pixel defining layer PDL.

As described above, by using the photoresist pattern PR, a separate mask process for forming via holes and contact holes is not necessitated. Accordingly, it is possible to reduce mask processes, and thus the process efficiency can be improved. Further, by using the photoresist pattern PR, it is possible to prevent a surface roughness of the via layer 165 from being increased during a dry etching process. Accordingly, light efficiency can be improved. Furthermore, by forming a step between the via hole and the contact hole or forming taper angles to be different, a transparent conductive layer may be more efficiently or effectively deposited in a subsequent process, thereby preventing a short circuit.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:
1. A display device comprising:
a lower metal layer disposed on a substrate;
a buffer layer disposed on the lower metal layer;
a first semiconductor layer disposed on the buffer layer;
a gate insulating layer disposed on the first semiconductor layer;
a first gate electrode disposed on the gate insulating layer overlapping the first semiconductor layer;
an interlayer insulating layer disposed on the first gate electrode;
a via layer disposed on the interlayer insulating layer;
a pixel electrode disposed on the via layer and electrically connected to the first semiconductor layer;
a light emitting layer disposed on the pixel electrode;
a common electrode disposed on the light emitting layer;
a first contact hole penetrating the buffer layer and the interlayer insulating layer, and a second contact hole penetrating the interlayer insulating layer; and
a first via hole and a second via hole each penetrating the via layer, wherein
the interlayer insulating layer includes a first upper surface not overlapping the via layer in the first via hole, and
the pixel electrode is electrically connected to the lower metal layer through the first contact hole and the first via hole, electrically connected to the first semiconductor layer through the second contact hole and the second via hole, and disposed on an inner peripheral surface of the first via hole, the first upper surface of the interlayer insulating layer, and an inner peripheral surface of the first contact hole.

2. The display device of claim 1, wherein the pixel electrode contacts the inner peripheral surface of the first via hole, the first upper surface of the interlayer insulating layer, and the inner peripheral surface of the first contact hole.

3. The display device of claim 1, wherein
the first contact hole overlaps the first via hole, and
the second contact hole overlaps the second via hole.

4. The display device of claim 3, wherein the first via hole exposes the first upper surface of the interlayer insulating layer surrounding the first contact hole.

5. The display device of claim 4, wherein a diameter of the first via hole is larger than a diameter of the first contact hole on a plane where the via layer and the interlayer insulating layer contact each other.

6. The display device of claim 1, wherein
the interlayer insulating layer includes a second upper surface in contact with the via layer,
the inner peripheral surface of the first via hole has a first taper angle between the inner peripheral surface of the first via hole and the second upper surface of the interlayer insulating layer,
the inner peripheral surface of the first contact hole has a second taper angle between the inner peripheral surface of the first contact hole and the second upper surface of the interlayer insulating layer, and
the first taper angle is smaller than the second taper angle.

7. The display device of claim 6, wherein the first taper angle is equal to or greater than about 30 degrees and equal to or less than about 60 degrees.

8. The display device of claim 1, wherein a surface roughness of the via layer is in a range of about 0.1 nm to about 2 nm.

9. The display device of claim 1, further comprising:
a data line disposed between the substrate and the buffer layer on the substrate; and
a first bridge electrode disposed on the via layer.

10. The display device of claim 9, further comprising:
a second semiconductor layer spaced apart from the first semiconductor layer on the buffer layer; and a second gate electrode disposed on the gate insulating layer,
wherein the gate insulating layer is disposed on the second semiconductor layer.

11. The display device of claim 10, further comprising:
a third contact hole penetrating the buffer layer and the interlayer insulating layer to expose the data line;
a third via hole penetrating the via layer to expose the third contact hole;
a fourth contact hole penetrating the interlayer insulating layer to expose a portion of the second semiconductor layer; and
a fourth via hole penetrating the via layer to expose the fourth contact hole.

12. The display device of claim 11, wherein the first bridge electrode is electrically connected to the data line through the third contact hole and the third via hole, and electrically connected to the second semiconductor layer through the fourth contact hole and the fourth via hole.

13. The display device of claim 11, further comprising:
a fifth contact hole penetrating the interlayer insulating layer to expose another portion of the second semiconductor layer;
a fifth via hole penetrating the via layer to expose the fifth contact hole;
a sixth contact hole penetrating the interlayer insulating layer to expose the first gate electrode;
a sixth via hole penetrating the via layer to expose the sixth contact hole; and
a second bridge electrode disposed on the via layer.

14. The display device of claim 13, wherein the second bridge electrode is electrically connected to another portion of the second semiconductor layer through the fifth contact hole and the fifth via hole, and electrically connected to the first gate electrode through the sixth contact hole and the sixth via hole.

15. The display device of claim 13, wherein the pixel electrode, the first bridge electrode, and the second bridge electrode are disposed on a same layer and include a same material.

16. A method for manufacturing a display device, the method comprising:
forming a lower metal layer disposed on a substrate;
forming a buffer layer disposed on the lower metal layer;
forming a first semiconductor layer disposed on the buffer layer;
forming a patterned gate insulating layer and a first gate electrode on the first semiconductor layer;
forming an interlayer insulating layer on the first gate electrode;
forming a via layer on the interlayer insulating layer;
forming a patterned hard mask layer on the via layer;
forming a first via hole by etching the via layer using the patterned hard mask layer as an etching mask;
forming a first contact hole by etching a portion of a first upper surface of the interlayer insulating layer exposed by the first via hole and the buffer layer formed under the interlayer insulating layer;
removing the patterned hard mask layer;
forming a pixel electrode on the via layer, an inner peripheral surface of the first via hole, the first upper surface of the interlayer insulating layer exposed by the first via hole, and an inner peripheral surface of the first contact hole formed in the interlayer insulating layer;
forming a light emitting layer on the pixel electrode; and
forming a common electrode on the light emitting layer.

17. The display device of claim 16, wherein the steps of etching the via layer, the interlayer insulating layer, and the buffer layer include performing a dry etching process using the patterned hard mask layer.

18. The display device of claim 17, wherein
the via layer is etched by an isotropic dry etching process, and
the interlayer insulating layer and the buffer layer are etched by an anisotropic dry etching process.

19. The display device of claim 18, wherein the isotropic dry etching process and the anisotropic dry etching process are performed by using a reaction gas containing fluorine (F) and oxygen ($O_2$).

20. The display device of claim 19, wherein the anisotropic dry etching process is performed by increasing the content of fluorine (F) and reducing the content of oxygen ($O_2$) in comparison to the isotropic dry etching process.

21. The display device of claim 16, wherein the patterned hard mask layer includes one selected from the group of consisting of ITO, IZO, IGZO, AlOx, ZrOx and HfOx.

* * * * *